(12) United States Patent
Kim et al.

(10) Patent No.: US 7,312,569 B2
(45) Date of Patent: Dec. 25, 2007

(54) FLAT PANEL DISPLAY APPARATUS

(75) Inventors: Hoon Kim, Suwon-si (KR); Jae-Hoon Chung, Suwon-si (KR); Joon-Hoo Choi, Seoul (KR); Sang-Pil Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 238 days.

(21) Appl. No.: 10/523,711

(22) PCT Filed: Dec. 24, 2004

(86) PCT No.: PCT/KR2004/003431

§ 371 (c)(1),
(2), (4) Date: Feb. 3, 2005

(87) PCT Pub. No.: WO2005/076756

PCT Pub. Date: Aug. 25, 2005

(65) Prior Publication Data

US 2006/0138928 A1    Jun. 29, 2006

(51) Int. Cl.
*H01J 1/62* (2006.01)

(52) U.S. Cl. .................................. 313/506; 313/503

(58) Field of Classification Search ................ 313/498, 313/503, 504, 506, 509, 512
See application file for complete search history.

(56) References Cited

U.S. PATENT DOCUMENTS

| | | |
|---|---|---|
| 2002/0180371 A1 | 12/2002 | Yamazaki et al. |
| 2003/0146696 A1 | 8/2003 | Park et al. |
| 2004/0017162 A1 | 1/2004 | Sato et al. |

*Primary Examiner*—Vip Patel
(74) *Attorney, Agent, or Firm*—MacPherson Kwok Chen & Held LLP

(57) ABSTRACT

A flat panel display apparatus includes a main plate, an organic light emitting element, a protecting layer and an attachable-detachable layer. The organic light emitting element includes a first electrode, a second electrode corresponding to the first electrode, and an organic light emitting layer disposed between the first and second electrodes to generate a light based on a current that flows between the first and second electrodes through the organic light emitting layer. The organic light emitting element is on the main plate. The protecting layer is on the organic light emitting element to protect the organic light emitting element. The attachable-detachable layer is on the protecting layer. Therefore, an image display quality is improved, and a manufacturing cost is decreased.

30 Claims, 31 Drawing Sheets

FLAT PANEL DISPLAY APPARATUS

TECHNICAL FIELD

The present invention relates to a flat panel display apparatus and method of manufacturing the flat panel display apparatus. More particularly, the present invention relates to a flat panel display apparatus capable of improving an image display quality and decreasing a manufacturing cost and a method of manufacturing the flat panel display apparatus.

BACKGROUND ART

An organic light emitting element of an organic light emitting display (OLED) apparatus includes an anode, a cathode and an organic light emitting layer. Holes that are provided from the anode are combined with electrons that are provided from the cathode in the organic light emitting layer to generate exciton having excited state. When the exciton changes from an excitation state to a ground state, a light is generated from the light emitting layer.

The OLED apparatus has various characteristics such as high luminance, wide viewing angle, thin thickness, low power consumption, etc. The OLED apparatus has simple structure compared to other display apparatus such as a cathode ray tube (CRT) apparatus so that a manufacturing cost of the OLED apparatus is lower than that of the CRT apparatus. In addition, the OLED apparatus is a light emissive type display apparatus to display a good image regardless of the viewing angle. Furthermore, the OLED apparatus may have flexible plate that may be bent in a direction that is in substantially perpendicular to a surface of the plate.

When the organic light emitting layer is exposed to water or oxygen, the organic light emitting layer is reacted with the water or the oxygen to deteriorate electrochemical characteristics of the organic light emitting layer. In order to isolate the organic light emitting layer from the water or the oxygen, the organic light emitting layer is in a closed space. Alternatively, the OLED apparatus may include a protecting layer that protects the organic light emitting layer from the water and the oxygen.

A metal can, a glass substrate, etc., may be on the organic light emitting element to form the closed space. When the organic light emitting layer is in the closed space, a manufacturing process of the OLED apparatus is complicated, and the manufacturing cost of the OLED apparatus is increased. In addition, a thickness of the OLED apparatus is increased so that a flexibility of the OLED apparatus is decreased.

An organic material is coated on the organic light emitting element to form the protecting layer. Alternatively, an inorganic material may be deposited on the organic light emitting element to form the protecting layer.

When a molecular weight of polymers in the protecting layer is increased, a permeability of the protecting layer is increased. In addition, when the protecting layer having the polymers is formed in a high temperature, a crack may be formed in the polymers.

When the inorganic layer is directly formed on the organic light emitting element, the organic light emitting element may be deteriorated by a heat generated from the deposition process. Therefore, the layer that makes contact with the organic light emitting element is formed at a low temperature. However, when the organic layer is formed at the low temperature, the permeability of the organic layer is increased.

The organic layer or the inorganic layer may form a protecting layer of other flat panel display apparatuses such as a liquid crystal display (LCD) apparatus, a plasma display panel (PDP) display apparatus, etc., or a touch panel.

DISCLOSURE OF THE INVENTION

Technical Problem

The present invention provides a flat panel display apparatus capable of improving an image display quality and decreasing a manufacturing cost.

The present invention also provides a method of manufacturing the flat panel display apparatus.

Technical Solution

A flat panel display apparatus in accordance with an aspect of the present invention includes a main plate, an organic light emitting element, a protecting layer and an attachable-detachable layer. The organic light emitting element includes a first electrode, a second electrode corresponding to the first electrode, and an organic light emitting layer disposed between the first and second electrodes to generate a light based on a current that flows between the first and second electrodes through the organic light emitting layer. The organic light emitting element is on the main plate. The protecting layer is on the organic light emitting element to protect the organic light emitting element. The attachable-detachable layer is on the protecting layer.

A flat panel display apparatus in accordance with another aspect of the present invention includes a main plate, an organic light emitting element, a protecting layer and an auxiliary plate. The organic light emitting element includes a first electrode, a second electrode corresponding to the first electrode and an organic light emitting layer disposed between the first and second electrodes to generate a light based on a current that flows between the first and second electrodes through the organic light emitting layer. The organic light emitting element is on the main plate. The protecting layer is on the organic light emitting element to protect the organic light emitting element. The auxiliary plate is on the protecting layer.

A flat panel display apparatus in accordance with still another aspect of the present invention includes a main plate, an organic light emitting element, a composite buffer layer and a protecting layer. The organic light emitting element includes a first electrode, a second electrode corresponding to the first electrode and an organic light emitting layer disposed between the first and second electrodes to generate a light based on a current that flows between the first and second electrodes through the organic light emitting layer. The organic light emitting element is on the main plate. The composite buffer layer is on the organic light emitting element. The composite buffer layer includes an organic layer and a plurality of inorganic insulation particles that are in the organic layer. The protecting layer is on the composite buffer layer to protect the organic light emitting element.

A method of manufacturing the flat panel display apparatus in accordance with an aspect of the present invention is provided as follows. An organic light emitting element having a first electrode, a second electrode corresponding to the first electrode and an organic light emitting layer disposed between the first and second electrodes to generate a light based on a current that flows between the first and second electrodes through the organic light emitting layer is formed on a main plate. An attachable-detachable layer is formed on an auxiliary plate. A protecting layer is formed on the attachable-detachable layer. The organic light emitting element is combined with the protecting layer. The auxiliary plate is removed from the protecting layer using the attachable-detachable layer.

A method of manufacturing the flat panel display apparatus in accordance with another aspect of the present invention is provided as follows. An organic light emitting element having a first electrode, a second electrode corresponding to the first electrode and an organic light emitting layer disposed between the first and second electrodes to generate a light based on a current that flows between the first and second electrodes through the organic light emitting layer is formed on a main plate. A protecting layer is formed on an auxiliary plate. The organic light emitting element is combined with the protecting layer.

A method of manufacturing the flat panel display apparatus in accordance with still another aspect of the present invention is provided as follows. An organic light emitting element having a first electrode, a second electrode corresponding to the first electrode and an organic light emitting layer disposed between the first and second electrodes to generate a light based on a current that flows between the first and second electrodes through the organic light emitting layer is formed on a main plate. A composite buffer layer is formed on the organic light emitting element. The composite buffer layer includes an organic layer and a plurality of inorganic insulation particles in the organic layer. A protecting layer is formed on the composite buffer layer to protect the organic light emitting element.

The flat panel display apparatus includes an organic light emitting display (OLED) apparatus. The OLED apparatus is classified into an active type OLED apparatus and a passive type OLED apparatus.

Therefore, the protecting layer of the flat panel display apparatus is formed using the auxiliary plate so that a thermal budget of the organic light emitting element is decreased. In addition, the protecting layer may be formed at a high temperature so that a permeability of the protecting layer is increased, thereby improving an image display quality of the flat panel display apparatus. Furthermore, the protecting layer may be formed under oxygen atmosphere so that a manufacturing cost of the flat panel display apparatus is decreased.

In addition, the flat panel display apparatus includes the organic buffer layer that has the inorganic insulation particles to protect the organic light emitting element from an impurity or an impact that is provided from an exterior to the organic light emitting element, thereby decreasing the thermal budget of the organic light emitting element.

BRIEF DESCRIPTION OF THE DRAWINGS

The above and other advantages of the present invention will become more apparent by describing in detail exemplary embodiments thereof with reference to the accompanying drawings, in which.

BEST MODE FOR CARRYING OUT THE INVENTION

It should be understood that the exemplary embodiments of the present invention described below may be varied modified in many different ways without departing from the inventive principles disclosed herein, and the scope of the present invention is therefore not limited to these particular following embodiments. Rather, these embodiments are provided so that this disclosure will be through and complete, and will fully convey the concept of the invention to those skilled in the art by way of example and not of limitation.

Hereinafter, the present invention will be described in detail with reference to the accompanying drawings.

Figure 1:
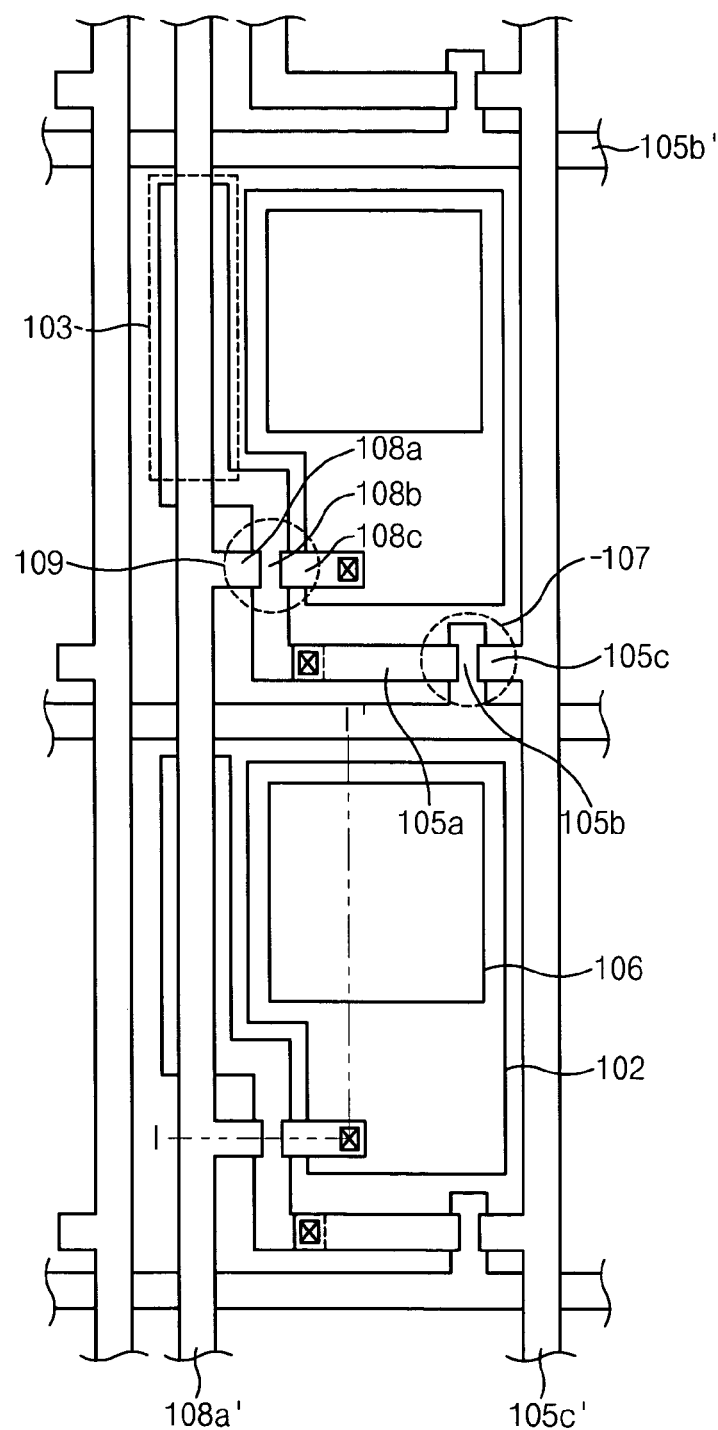
FIG. 1 is a plan view showing a flat panel display apparatus in accordance with an exemplary embodiment of the present invention.
Figure 2:
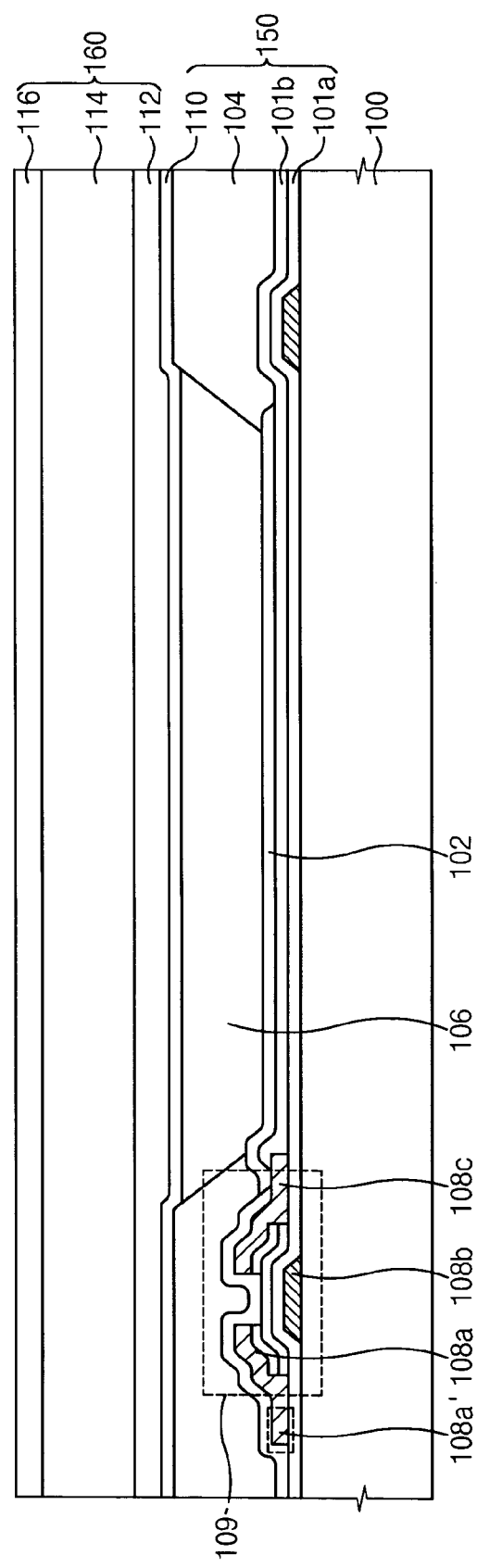
FIG. 2 is a cross-sectional view taken along the line I-I' of FIG. 1.

FIG. 1 is a plan view showing a flat panel display apparatus in accordance with an exemplary embodiment of the present invention. FIG. 2 is a cross-sectional view taken along the line I-I' of FIG. 1.

Referring to FIGS. 1 and 2, the flat panel display apparatus includes a main plate 100, an organic light emitting element 150, a storage capacitor 103 and a protecting film assembly 160.

The main plate 100 includes glass, triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP), etc., or combinations thereof.

The organic light emitting element 150 includes a gate insulating layer 101a, an inorganic insulating layer 101b, an anode electrode 102, a bank 104, an organic light emitting layer 106, a switching transistor 107, a driving transistor 109 and a cathode electrode 110.

The switching transistor 107 includes a first source electrode 105c, a first gate electrode 105b, a first drain electrode 105a and a first semiconductor layer pattern. The first source electrode 105c is electrically connected to a data line 105c' so that a driving integrated circuit (not shown) outputs a data signal to the first source electrode 105c through the data line 105c'. The first gate electrode 105b is on the main plate 100, and the first gate electrode 105b is electrically connected to a gate line 105b' so that the driving integrated circuit outputs a gate voltage to the first gate electrode 105b through the gate line 105b'. The first drain electrode 105a is spaced apart from the first source electrode 105c. The first semiconductor layer pattern is disposed between the first drain electrode 105a and the first source electrode 105c.

The driving transistor 109 includes a second source electrode 108a, a second gate electrode 108b, a second drain electrode 108c and a second semiconductor layer pattern. The second source electrode 108a is electrically connected to a drain voltage line 108a' to receive a drain voltage. The second gate electrode 108b is on the main plate 100, and the second gate electrode 108b is electrically connected to the first drain electrode 105a of the switching transistor 107 through an auxiliary contact hole. The second drain electrode 108c is spaced apart from the second source electrode 108a. The second semiconductor layer pattern is between the second drain electrode 108c and the second source electrode 108a.

When the data voltage and the gate voltage are applied to the data line 105c' and the gate line 105b', respectively, the data voltage is applied to the second gate electrode 108b through the first source electrode 105c, the first semiconductor layer pattern and the first drain electrode 105a. When the data voltage is applied to the second gate electrode 108b, a channel is formed in the second semiconductor layer pattern so that the drain voltage is applied to the second drain electrode 108c.

The gate insulating layer 101a electrically insulates the first gate electrode 105b, the gate line 105b' and the second gate electrode 108b from the first source electrode 105a, the data line 105c', the first drain electrode 105c, the second source electrode 108a, the drain voltage line 108a' and the second drain electrode 108c. The gate insulating layer 101a includes a transparent insulating material such as silicon oxide, silicon nitride, etc.

The inorganic insulating layer 101b is on the main plate 100 having the switching transistor 107, the driving transistor 109, the gate line 105b', the data line 105c' and the drain voltage line 108a'. The inorganic insulating layer 101b includes a contact hole through which the second drain electrode 108c is electrically connected to anode electrode 102. The inorganic insulating layer 101b includes a transparent insulating material such as silicon oxide, silicon nitride, etc.

The second gate electrode 108b is partially overlapped with the drain voltage line 108a' to form the storage capacitor 103. The storage capacitor 103 maintains a voltage difference between the anode electrode 102 and the cathode electrode 110 for one frame.

The anode electrode 102 is on the main plate 100 in a region defined by the drain voltage line 108a', the gate line 105b' and the data line 105c'. The anode electrode 102 includes a conductive material such as a metal. Alternatively, the anode electrode may be on the organic light emitting layer, and the cathode electrode may be on the inorganic insulating layer and electrically connected to the second drain electrode.

The bank 104 is on the inorganic insulating layer 101b having the anode electrode 102 to form a recessed portion on a central portion of the anode electrode 102.

The organic light emitting layer 106 is in the recessed portion formed by the bank 104. In this exemplary embodiment, the organic light emitting layer 106 includes Alq3(tris (8-hydroxy-quinolate)aluminum). The organic light emitting layer 106 includes a red organic light emitting portion, a green organic light emitting portion and a blue organic light emitting portion. In this exemplary embodiment, the red light emitting portion includes dichloromethane (DCM), 4-(dicyanomethylene)-2-methyl-6-(1,1,7,7-tetramethyljulolidin-9-yl)-4H-pyran (DCJT), 4-[dicyanomethylene]-2-methyl-6-(1,1,7,7-tetramethyljulolidin-9-yl)-4H-pyran (DCJTB), etc., and the green light emitting portion includes coumarin 6, quinacridone (Qd), etc.

The cathode electrode 110 is on the organic light emitting layer 106 and the bank 104 to receive a common voltage. The cathode electrode 110 includes a transparent conductive material such as indium tin oxide (ITO), tin oxide (TO), indium zinc oxide (IZO), zinc oxide (ZO), etc.

The drain voltage that is applied to the second drain electrode 108c is applied to the anode electrode 102 through the contact hole. Therefore, a current flows between the anode electrode 102 and the cathode electrode 110 through the organic light emitting layer 108. Holes that are provided from the anode electrode 102 is combined with electrons that are provided from the cathode 110 in the organic light emitting layer 108 to generate molecules having excited state. When the state of the molecules is converted from the excited state into ground state, a light is generated from the molecules.

The protecting film assembly 160 includes an adhesive layer 112, a protecting layer 114 and an attachable-detachable layer 116. The protecting film assembly 160 is on the organic light emitting element 150.

The adhesive layer 112 is on the cathode electrode 110 so that the protecting layer 114 is combined with the organic light emitting element 150. In this exemplary embodiment, the adhesive layer 112 includes a light curable resin or a thermally curable resin. When an ultraviolet having a wavelength of about 200 nm to about 500 nm is irradiated into the light curable resin, the light curable resin is solidified. The thermally curable resin is solidified at a temperature of about 25° C. to about 200° C. The adhesive layer 112 may function as an auxiliary protecting layer that protects the organic light emitting element 150 from the water or the oxygen.

Although the ultraviolet or the heat is applied to the solidified adhesive layer 112, the solidified adhesive layer 112 may not liquefied so that the protecting layer 114 is combined with the organic light emitting element 150.

The protecting layer 114 is on the adhesive layer 112 to protect the organic light emitting element 150 from an impurity or an impact that is provided from an exterior to the organic light emitting element 150. The protecting layer 114 isolates the organic light emitting layer 106 of the organic light emitting element 150 from the water or the oxygen, and the protecting layer 114 may absorb water.

The protecting layer 114 includes an inorganic protecting layer, an organic protecting layer, a hygroscopic layer, etc., or a composite layer having a mixture thereof.

The inorganic protecting layer includes aluminum (Al), molybdenum (Mo), titanium (Ti), chromium (Cr), gold (Ag), silicon oxide, silicon nitride, silicon oxynitride, magnesium oxide, aluminum oxide, aluminum nitride, titanium oxide, etc., or combinations thereof. The organic protecting layer includes a polymer resin, a parylene resin, etc.

The polymer resin has low permeability. The polymer resin includes an epoxy resin, a silicone resin, a fluoric resin, an acrylic resin, an urethane resin, a phenolic resin, a polyethylene resin, a polypropylene resin, a polystyrene resin, a polymethyl methacrylate resin, a polyurea resin, a polyimide resin, etc., or combinations thereof.

The hygroscopic layer includes inorganic silica, silicon carbide, activated carbon, etc., or combinations thereof.

The attachable-detachable layer 116 is on the protecting layer 114. An adhesiveness of the attachable-detachable layer 116 is varied in accordance with light, heat or pressure so that the attachable-detachable layer 116 may be attached or detached. For example, when the attachable-detachable layer 116 includes a photoresist, and the light is irradiated onto the attachable-detachable layer 116, the adhesiveness of the attachable-detachable layer 116 is decreased. Alternatively, the attachable-detachable layer 116 may include an isocyanate, a vinyl acetate, a polyester, a polyvinyl alcohol, an acrylate, an epoxy, a synthetic rubber, a thermoplastic resin, etc. For example, when the attachable-detachable layer 116 includes the vinyl acetate resin, the adhesiveness of the attachable-detachable layer 116 is greatly decreased at a temperature of more than about 40° C. In this exemplary embodiment, the attachable-detachable layer 116 includes 'Selfa tape' manufactured by Sekisui Company in Japan.

The adhesive layer 112 and/or the attachable-detachable layer 116 may function as an auxiliary protecting layer to protect the organic light emitting element 150 from the water or the oxygen.

FIGS. 3 to 6 are cross-sectional views showing a method of manufacturing a flat panel display apparatus in accordance with an exemplary embodiment of the present invention.

Figure 3:
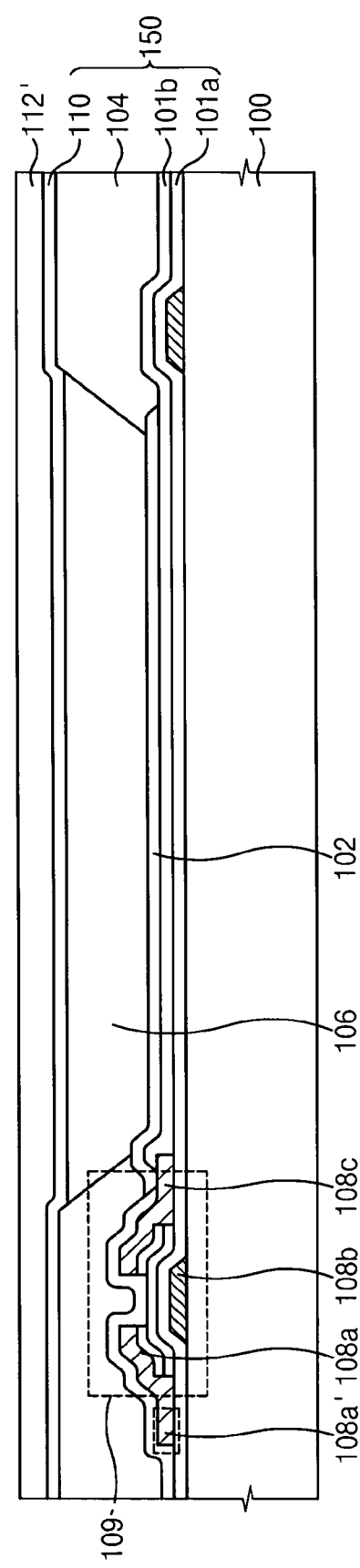
FIGS. 3 to 6 are cross-sectional views showing a method of manufacturing a flat panel display apparatus in accordance with an exemplary embodiment of the present invention.

Referring to FIG. 3, a metal is deposited on the main plate 100. The deposited metal is partially etched to form the first gate electrode 105b, the gate line 105b' and the second gate electrode 108b.

The transparent insulating material is deposited on the main plate having the first gate electrode 105b, the gate line 105b' and the second gate electrode 108b. The deposited transparent insulating material is partially etched to form the gate insulating layer 101a having the auxiliary contact hole through which the first drain electrode 105a is electrically connected to the second gate electrode 108b.

Amorphous silicon patterns and N+amorphous silicon patterns that are on the amorphous silicon patterns, respectively, are formed on the gate insulating layer 101a corresponding to the first and second gate electrodes 105b and 108b to form the first and second semiconductor layer patterns.

A metal is deposited on the gate insulating layer 101a having the first and second semiconductor layer patterns. The deposited metal is partially etched to form the first source electrode 105c, the data line 105c', the first drain electrode 105a, the second source electrode 108a, the drain voltage line 108a', the second drain electrode 108c and the storage capacitor 103. Therefore, the switching transistor 107 having the first source electrode 105c, the first gate electrode 105b, the first drain electrode 105a and the first semiconductor layer pattern, and the driving transistor 109 having the second source electrode 108c, the second gate electrode 108b, the second drain electrode 108a and the second semiconductor layer pattern are formed on the main plate 100.

The transparent insulating material is deposited on the main plate 100 having the switching transistor 107, the driving transistor 109, the gate line 105b', the data line 105c' and the drain voltage line 108a'. The deposited transparent insulating material is partially etched to form the inorganic insulating layer 101b having the contact hole through which the second drain electrode 108c is partially exposed.

A metal is deposited on the inorganic insulating layer 101b. The deposited metal is partially etched to form the anode electrode 102. The anode electrode 102 is electrically connected to the second drain electrode 108c through the contact hole.

The organic material having the photoresist is coated on the inorganic insulating layer 101b having the anode electrode 102. The coated organic material is partially removed through a photo process to form the bank 104 having the recessed portion. The photo process includes an exposure step and a development step.

A material that forms the organic light emitting layer 106 is dropped in the recessed portion through an ink jet process to form the organic light emitting layer 106.

The transparent conductive material is deposited on the organic light emitting layer 106 and the bank 104 to form the cathode electrode 110.

Therefore, the organic light emitting element 150 having the gate insulating layer 101a, the inorganic insulating layer 101b, the anode electrode 102, the bank 104, the organic light emitting layer 106, the switching transistor 107, the driving transistor 109 and the cathode electrode 110 is completed.

An adhesive material having the light curable resin is coated on the main plate 100 having the organic light emitting element 150. The coated adhesive material 112' is not solidified. Alternatively, the adhesive material 112' may be coated on the protecting layer 114 formed on the attachable-detachable layer 116.

Figure 4:
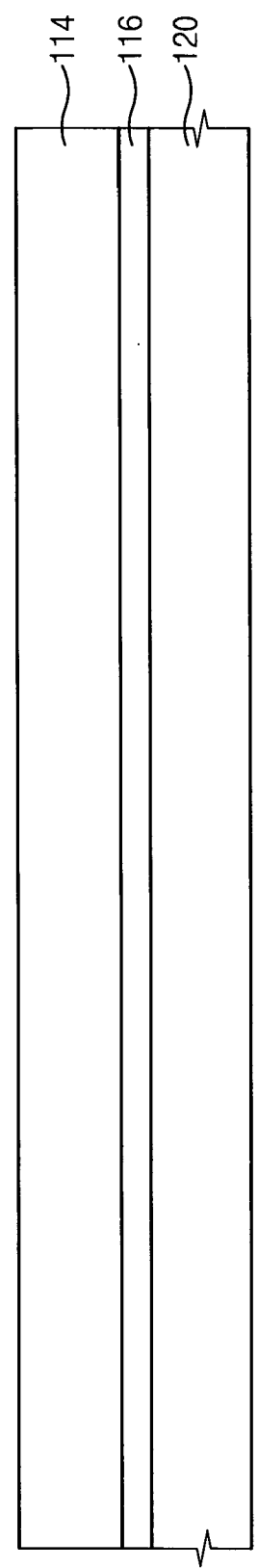

Referring to FIG. 4, the 'Selfa Tape' is formed on an auxiliary plate 120 to form the attachable-detachable layer 116.

In this exemplary embodiment, the auxiliary plate 120 is a flexible plate. The auxiliary plate 120 includes glass, a conductive material, ceramic, triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP), etc., or combinations thereof. The auxiliary plate 120 may have a thermally conductive material.

When the light or the heat is irradiated into the attachable-detachable layer 116, the adhesiveness of the attachable-detachable layer 116 is decreased so that the attachable-detachable layer 116 may be separated from the auxiliary plate 120.

The silicon oxide is deposited on the attachable-detachable layer 116 to form the inorganic protecting layer. The epoxy is coated on the inorganic protecting layer to form the organic protecting layer. Therefore, the protecting layer 114 includes a double-layered structure having the inorganic protecting layer and the organic protecting layer. The protecting layer 114 is formed on the attachable-detachable layer 116 that is on the auxiliary plate 120 so that the protecting layer 114 may be formed at the high temperature, under the water atmosphere or under the oxygen atmosphere. Therefore, the silicon oxide may be deposited on the attachable-detachable layer 116 at a temperature of more than about 200° C., and the epoxy may be coated on the inorganic protecting layer at a temperature of more than about 200° C. so that permeability of the protecting layer 114 is decreased. Alternatively, another inorganic protecting layer may be formed on the organic protecting layer.

Figure 5:
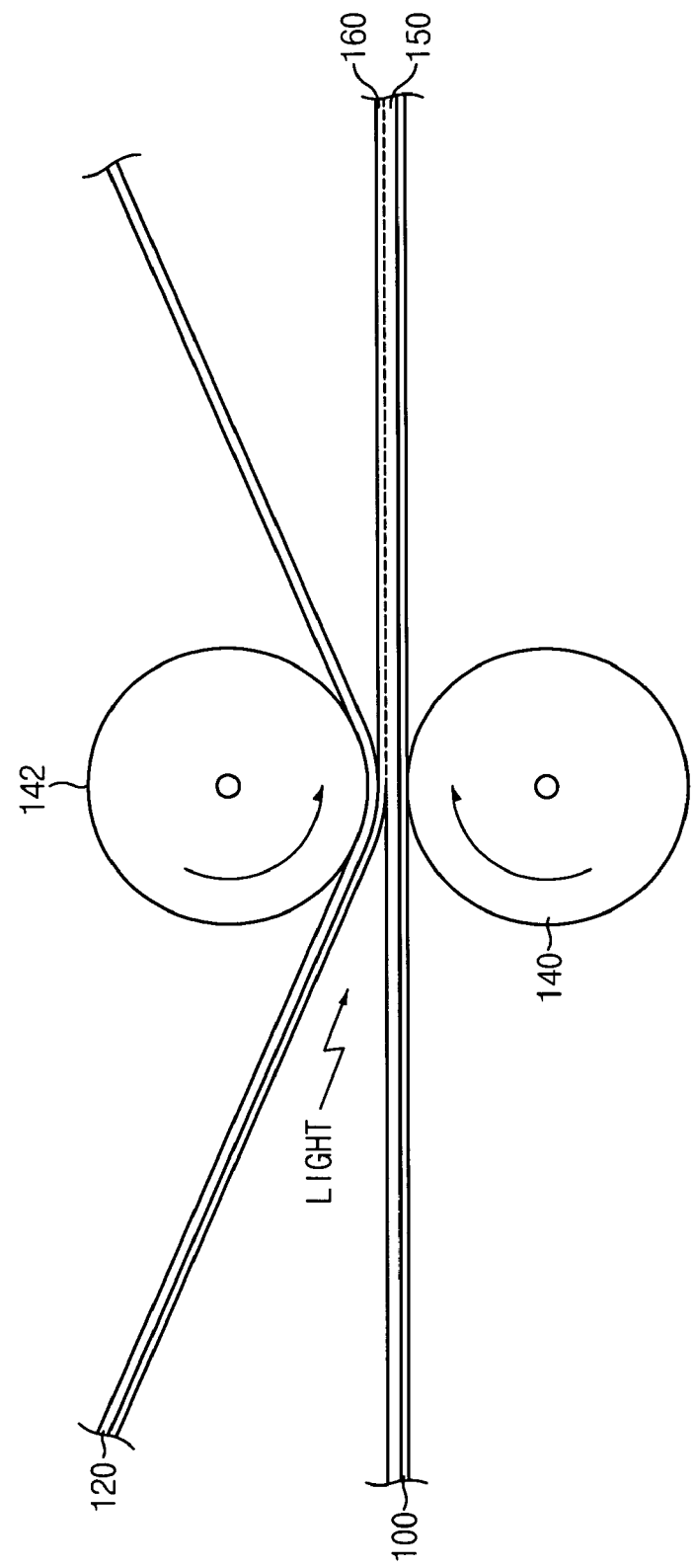
Figure 6:
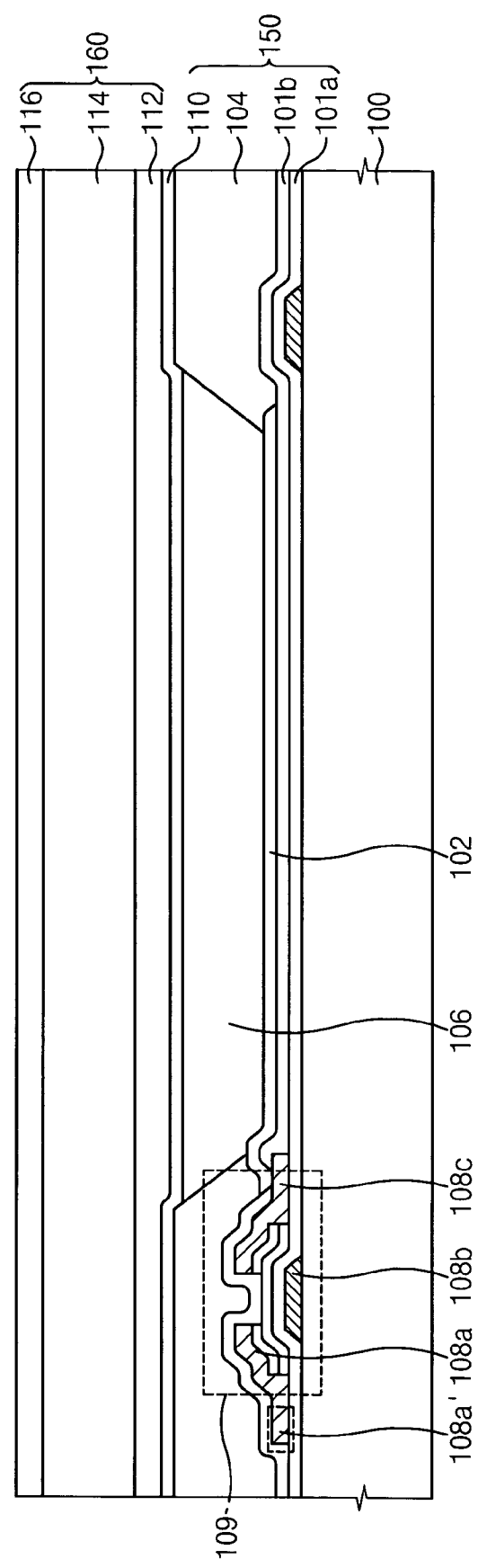

Referring to FIGS. 5 and 6, the main plate 100 having the organic light emitting element 150 and the adhesive layer 110 is combined with the auxiliary plate 120 having the attachable-detachable layer 116 and the protecting layer 114 so that the adhesive material 112' of FIG. 3 faces the protecting layer 114. The combined plates 100 and 120 are pressed between an upper roller 142 and a lower roller 140. The upper roller 142 rolls in an opposite direction to the lower roller 140. In this exemplary embodiment, an interval between outer surfaces of the upper and lower rollers 142 and 140 is substantially equal to a summation of thicknesses of the main plate 100, the light emitting element 150 and the auxiliary plate 120.

The ultraviolet is irradiated between the upper and lower rollers 142 and 140. When the ultraviolet ray is irradiated into the attachable-detachable layer 116 and the adhesive material 112' of FIG. 3, the adhesive material 112' of FIG. 3 is solidified so that the protecting layer 114 is combined with the organic light emitting element 150, whereas the adhesiveness of the attachable-detachable layer 116 is decreased so that the attachable-detachable layer 116 is separated from the auxiliary plate 120. That is, when the ultraviolet is irradiated into the adhesive material 112' of FIG. 3 that is not solidified, the adhesive material 112' of FIG. 3 is solidified so that the attachable-detachable layer 116 and the protecting layer 114 are combined with the organic light emitting element 150. Alternatively, the attachable-detachable layer 116 may also be removed from the protecting layer 114 together with the auxiliary plate 120.

Therefore, the protecting film assembly 160 having the attachable-detachable layer 116, the protecting layer 114 and the adhesive layer 112 is formed on the organic light emitting element 150 so that the flat panel display apparatus is completed.

According to this exemplary embodiment, after the protecting layer 114 is formed on the auxiliary plate 120, the protecting layer 114 is attached onto the organic light emitting element 150, and the auxiliary plate 120 is then removed from the protecting layer 114 using the attachable-detachable layer 116. Therefore, the thermal budget of the organic light emitting element 150 is decreased, and the permeability of the protecting layer 114 is decreased. In addition, the protecting layer 114 may be formed under the oxygen atmosphere.

Thin films such as an organic layer, an inorganic layer, an overcoating layer, etc., of other flat panel display apparatuses such as a liquid crystal display (LCD) apparatus, a plasma display panel (PDP) display apparatus, etc., or a touch panel may also be formed using the auxiliary plate 120.

Figure 7:
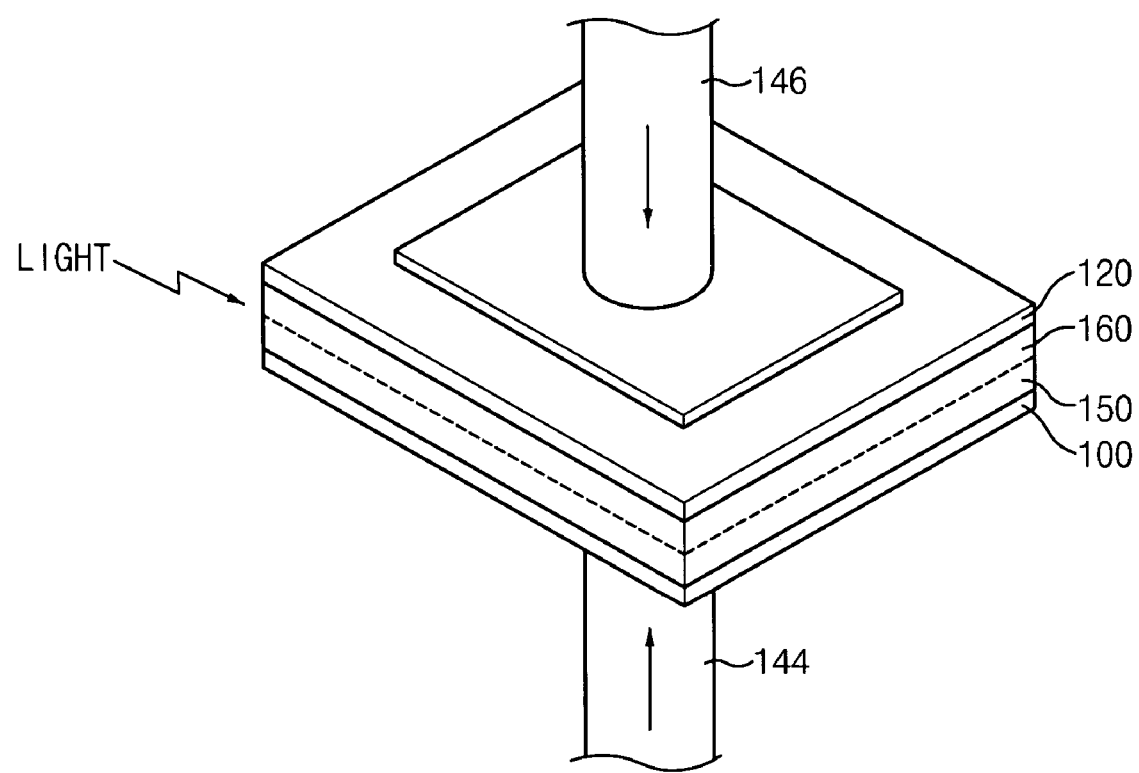
FIG. 7 is a perspective view showing a method of manufacturing a flat panel display apparatus in accordance with another exemplary embodiment of the present invention.

FIG. 7 is a perspective view showing a method of manufacturing a flat panel display apparatus in accordance with another exemplary embodiment of the present invention. The flat panel display apparatus of FIG. 7 is same as in FIGS. 1 to 6 except a compression process. Thus, the same reference numerals will be used to refer to the same or like parts as those described in FIGS. 1 to 6 and any further explanation will be omitted.

Referring to FIGS. 1 to 7, the flat panel display apparatus includes a main plate 100, an organic light emitting element 150, a storage capacitor 103 and a protecting film assembly 160.

The organic light emitting element 150 includes a gate insulating layer 101*a*, an inorganic insulating layer 101*b*, an anode electrode 102, a bank 104, an organic light emitting layer 106, a switching transistor 107, a driving transistor 109 and a cathode electrode 110.

The protecting film assembly 160 includes an adhesive layer 112, a protecting layer 114 and an attachable-detachable layer 116. The protecting film assembly 160 is on the organic light emitting element 150.

Referring to FIG. 7, the main plate 100 having the organic light emitting element 150 and the adhesive layer 110 is combined with the auxiliary plate 120 having the attachable-detachable layer 116 and the protecting layer 114 so that the adhesive material 112' of FIG. 3 faces the protecting layer 114. The combined plates 100 and 120 are pressed between an upper press 146 and a lower press 144. The upper press 146 presses the combined plates 100 and 120 in an opposite direction to the lower press 144. In this exemplary embodiment, an interval between outer surfaces of the upper and lower presses 146 and 144 is substantially equal to a summation of thicknesses of the main plate 100, the light emitting element 150 and the auxiliary plate 120.

The ultraviolet is irradiated between the upper and lower presses 146 and 144. Alternatively, the upper and lower presses 146 and 144 may be heated so that the adhesive layer 116 and the attachable-detachable layer 112 may be heated.

When the ultraviolet ray is irradiated into the attachable-detachable layer 116 and the adhesive material 112', the adhesive material 112' is solidified so that the protecting layer 114 is combined with the organic light emitting element 150, whereas the adhesiveness of the attachable-detachable layer 116 is decreased so that the attachable-detachable layer 116 is separated from the auxiliary plate 120.

The upper press 146 is depressed so that the auxiliary plate 120 is separated from the attachable-detachable layer 116.

Therefore, the protecting film assembly 160 having the attachable-detachable layer 116, the protecting layer 114 and the adhesive layer 112 is formed on the organic light emitting element 150 to form the flat panel display apparatus.

According to this exemplary embodiment, a manufacturing process of the flat panel display apparatus is simplified using the upper press 146, the lower press 144 and the auxiliary plate 120. In addition, an image display quality of the flat panel display apparatus is improved.

Figure 8:
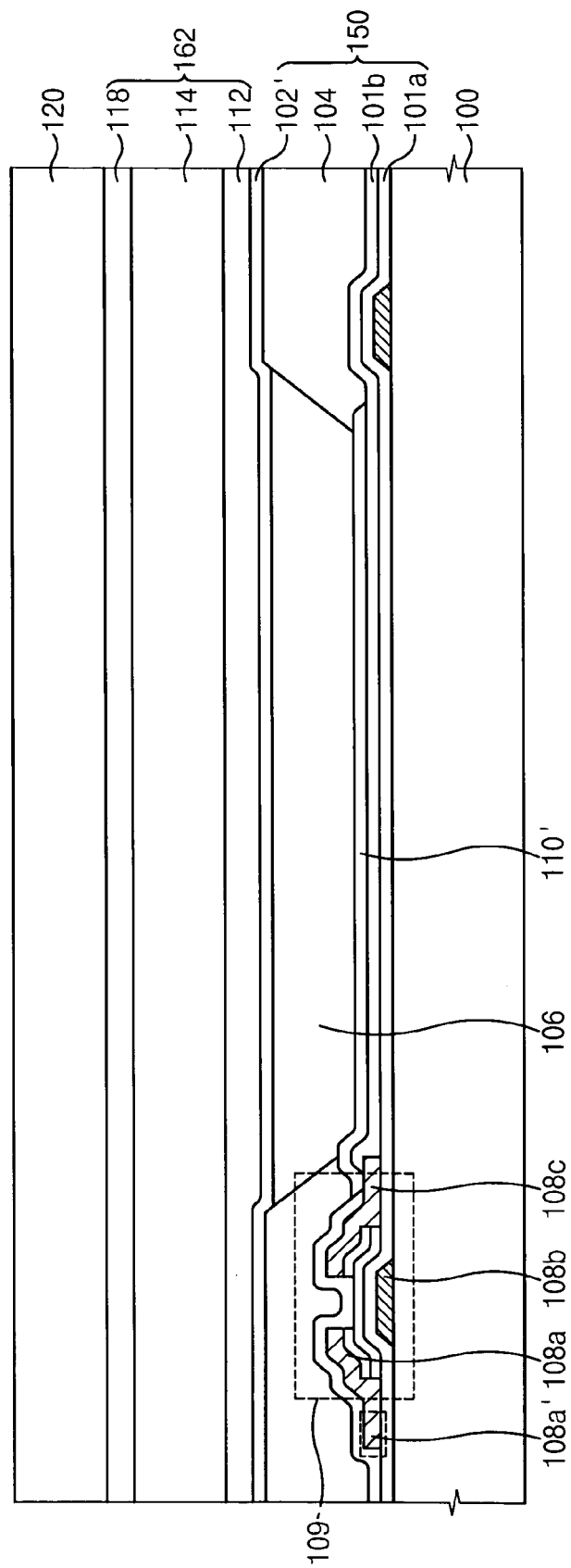
FIG. 8 is a cross-sectional view showing a flat panel display apparatus in accordance with another exemplary embodiment of the present invention.

FIG. 8 is a cross-sectional view showing a flat panel display apparatus in accordance with another exemplary embodiment of the present invention. The flat panel display apparatus of FIG. 8 is same as in FIGS. 1 and 2 except an auxiliary adhesive layer and an auxiliary plate. Thus, the same reference numerals will be used to refer to the same or like parts as those described in FIGS. 1 and 2 and any further explanation will be omitted.

Referring to FIGS. 1 and 8, the flat panel display apparatus includes a main plate 100, an organic light emitting element 150, a storage capacitor 103, a protecting film assembly 162 and an auxiliary plate 120.

The organic light emitting element 150 includes a gate insulating layer 101*a*, an inorganic insulating layer 101*b*, a cathode electrode 110', a bank 104, an organic light emitting layer 106, a switching transistor 107, a driving transistor 109 and an anode electrode 102'.

The cathode electrode 110' is on the inorganic insulating layer 101*b*, and includes a transparent conductive material such as indium tin oxide (ITO), tin oxide (TO), indium zinc oxide (IZO), zinc oxide (ZO), etc. The anode electrode 102' is on the organic light emitting layer 106, and includes a conductive material such as a metal. Alternatively, the cathode electrode may be on the organic light emitting layer, and the anode electrode may be on the inorganic insulating layer and electrically connected to a second drain electrode of the driving transistor.

The protecting film assembly 162 includes an adhesive layer 112, a protecting layer 114 and an auxiliary adhesive layer 118. The protecting film assembly 162 is on the organic light emitting element 150.

The adhesive layer 112 is on the anode electrode 102' so that the protecting layer 114 is combined with the organic light emitting element 150. The adhesive layer 112 includes a light curable resin or a thermally curable resin.

The protecting layer 114 is on the adhesive layer 112 to protect the organic light emitting element 150 from an impurity or an impact that is provided from an exterior to the organic light emitting element 150.

The auxiliary adhesive layer 118 is on the protecting layer 114. The auxiliary adhesive layer 118 includes the light curable resin or the thermally curable resin.

The auxiliary plate 120 is combined with the protecting layer 114 using the auxiliary adhesive layer 118. The auxiliary plate 120 includes glass, triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP), etc., or combinations thereof.

When the light generated from the organic light emitting element 150 is guided into the auxiliary plate 120, the auxiliary plate 120 has a transparent material, and the auxiliary plate 120 is optically isotropic. However, when the light generated from the organic light emitting element 150 is guided into the main plate 100, the auxiliary plate 120 may have an opaque material.

FIGS. 9 to 12 are cross-sectional views showing a method of manufacturing a flat panel display apparatus in accordance with another exemplary embodiment of the present invention.

Figure 9:
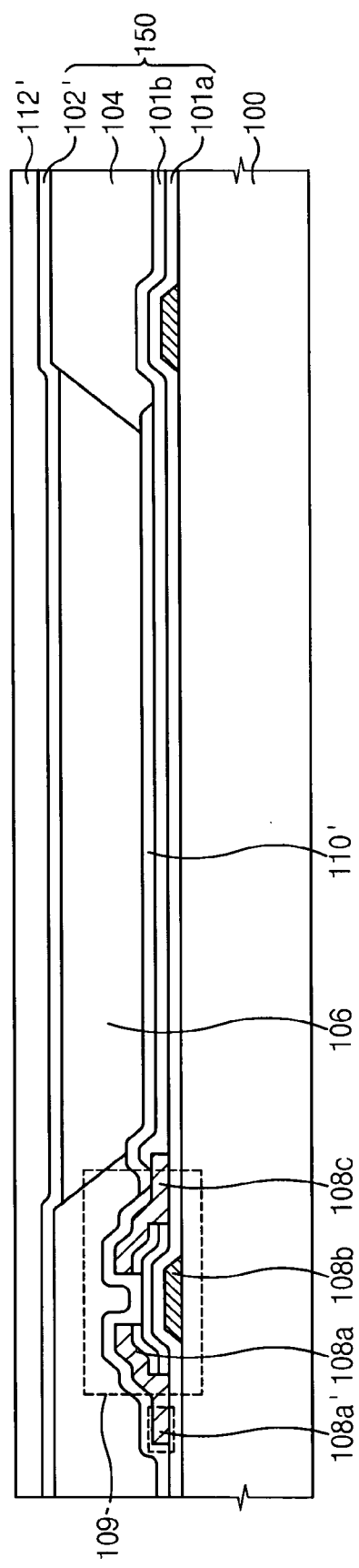
FIGS. 9 to 12 are cross-sectional views showing a method of manufacturing a flat panel display apparatus in accordance with another exemplary embodiment of the present invention.

Referring to FIG. 9, the gate insulating layer 101a, the inorganic insulating layer 101b, the switching transistor 107, the driving transistor 109, the cathode electrode 110', the bank 104, the organic light emitting layer 106 and the anode electrode 102' are formed on the main plate 100 so that the organic light emitting element 150 is completed.

An adhesive material having the light curable resin is coated on the main plate 100 having the organic light emitting element 150. The coated adhesive material 122' is not solidified.

Figure 10:
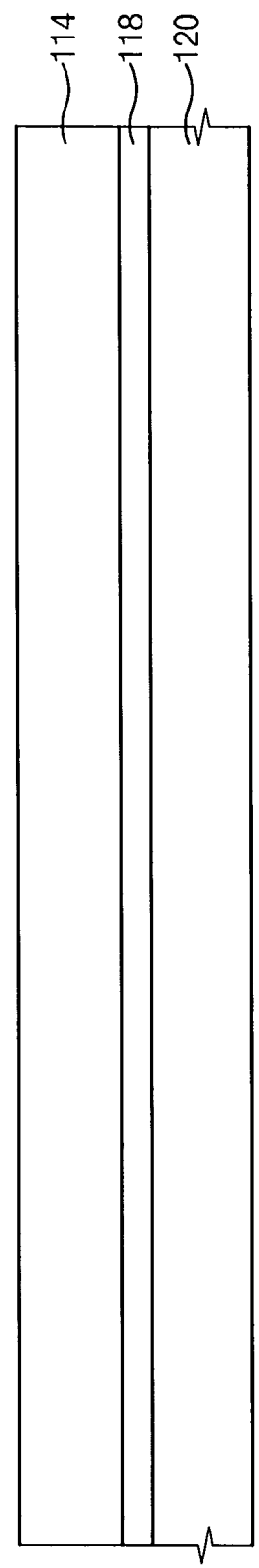

Referring to FIG. 10, a light curable material is coated on the auxiliary plate 120, and the protecting layer 114 is formed on the coated light curable material. A light is irradiated into the coated light curable material to solidify the light curable material, thereby forming the auxiliary adhesive layer 118.

Figure 11:
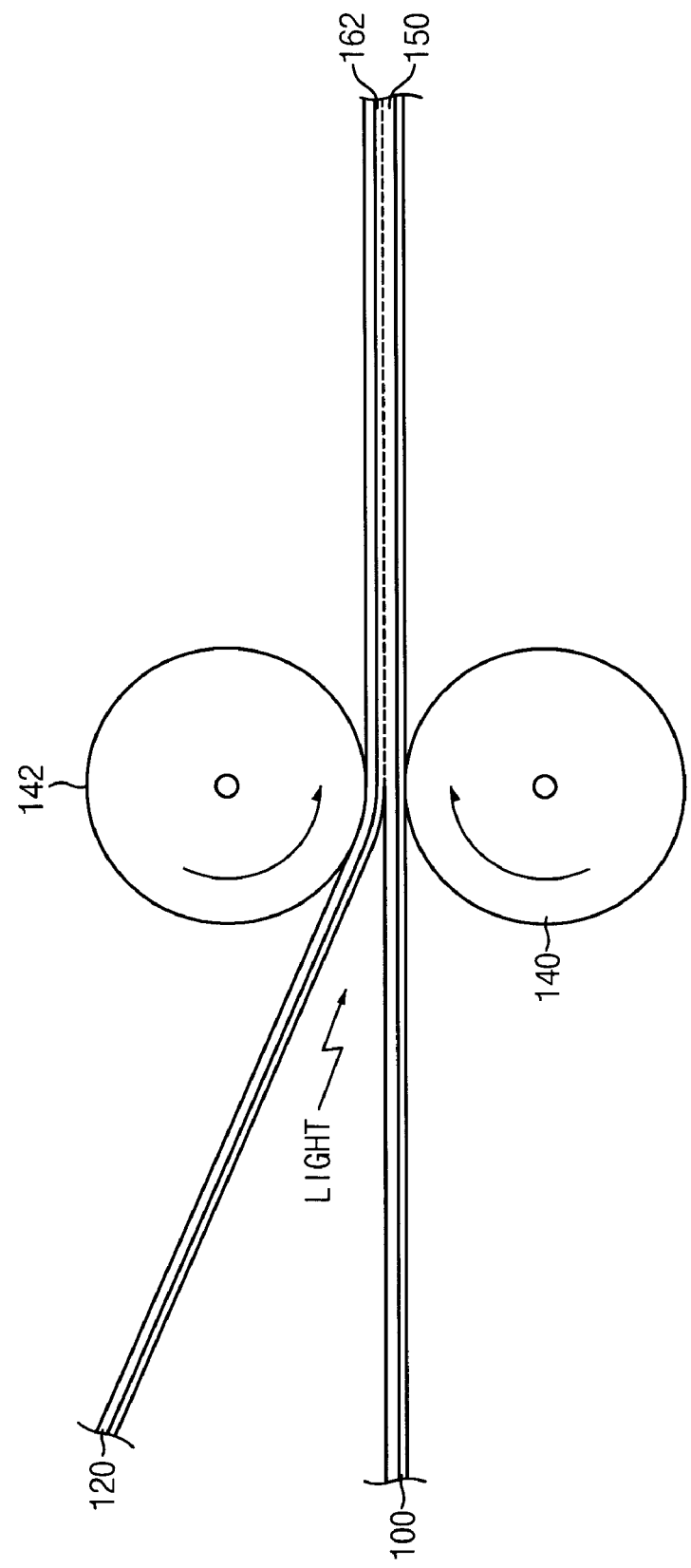
Figure 12:
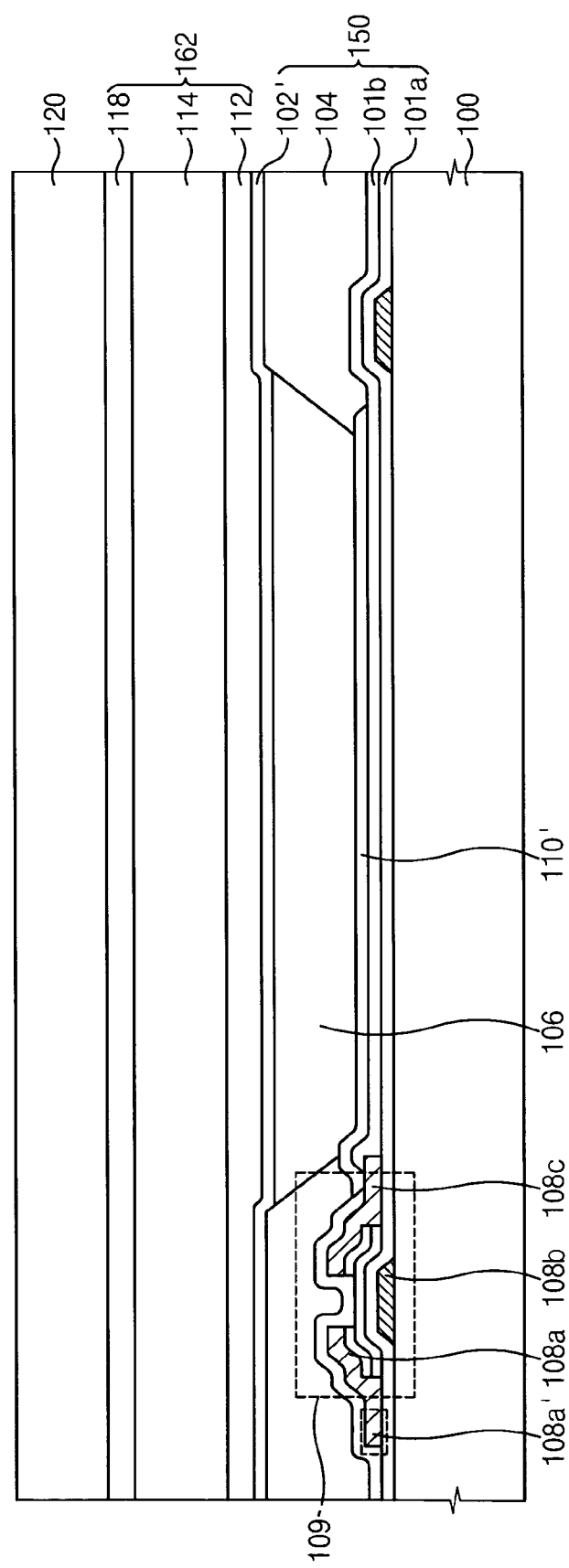

Referring to FIGS. 11 and 12, the main plate 100 having the organic light emitting element 150 and the adhesive material 122' is combined with the auxiliary plate 120 having the auxiliary adhesive layer 118 and the protecting layer 114 so that the adhesive material 112' faces the protecting layer 114. The combined plates 100 and 120 are pressed between an upper roller 142 and a lower roller 140.

An ultraviolet is irradiated between the upper and lower rollers 142 and 140. When the ultraviolet ray is irradiated into the auxiliary adhesive layer 118 and the adhesive material 112', the adhesive material 112' is solidified so that the protecting layer 114 is combined with the organic light emitting element 150, whereas the adhesiveness of the auxiliary adhesive layer 118 is not changed so that the protecting layer 114 is combined with the auxiliary plate 120.

Therefore, the protecting film assembly 162 having the auxiliary adhesive layer 118, the protecting layer 114 and the adhesive layer 112 is formed on the organic light emitting element 150 so that the flat panel display apparatus is completed.

According to this exemplary embodiment, the flat panel display apparatus includes the auxiliary plate 120 on the protecting layer 114 to protect the organic light emitting element 150 from water, oxygen and an impact that is provided from an exterior to the flat panel display apparatus. In addition, a manufacturing process of the flat panel display apparatus is simplified.

Figure 13:
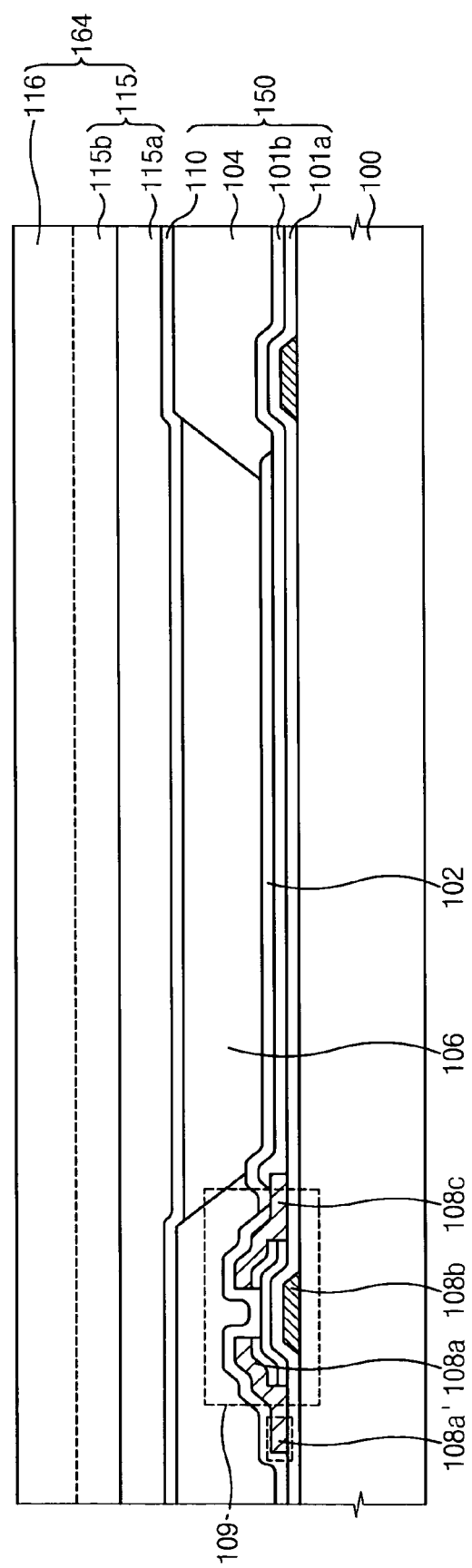
FIG. 13 is a cross-sectional view showing a flat panel display apparatus in accordance with another exemplary embodiment of the present invention.

FIG. 13 is a cross-sectional view showing a flat panel display apparatus in accordance with another exemplary embodiment of the present invention. The flat panel display apparatus of FIG. 13 is same as in FIGS. 1 and 2 except an adhesive layer. Thus, the same reference numerals will be used to refer to the same or like parts as those described in FIGS. 1 and 2 and any further explanation will be omitted.

Referring to FIGS. 1 and 13, the flat panel display apparatus includes a main plate 100, an organic light emitting element 150, a storage capacitor 103 and a protecting film assembly 164.

The organic light emitting element 150 includes a gate insulating layer 101a, an inorganic insulating layer 101b, an anode electrode 102, a bank 104, an organic light emitting layer 106, a switching transistor 107, a driving transistor 109 and a cathode electrode 110.

The protecting film assembly 164 includes a protecting layer 115 and an attachable-detachable layer 116. The protecting film assembly 160 is on the organic light emitting element 150.

The protecting layer 115 is on the organic light emitting element 150 to protect the organic light emitting element 150 from an impurity or an impact that is provided from an exterior to the organic light emitting element 150. The protecting layer 115 includes a first protecting portion 115a and a second protecting portion 115b.

The first protecting portion 115a is on the organic light emitting element 150, and the first protecting portion 115a includes a light curable resin or a thermally curable resin. The second protecting portion 115b is on the first protecting portion 115a. The second protecting layer 115 may include an inorganic protecting layer or an organic protecting layer. Alternatively, the second protecting layer 115 may have a multi-layered structure having the inorganic protecting layer and the organic protecting layer.

The attachable-detachable layer 116 is on the protecting layer 115. An adhesiveness of the attachable-detachable layer 116 is varied by light, heat or pressure so that the attachable-detachable layer 116 may be attached or detached. The attachable-detachable layer 116 may include a photoresist.

FIGS. 14 to 17 are cross-sectional views showing a method of manufacturing a flat panel display apparatus in accordance with another exemplary embodiment of the present invention.

Figure 14:
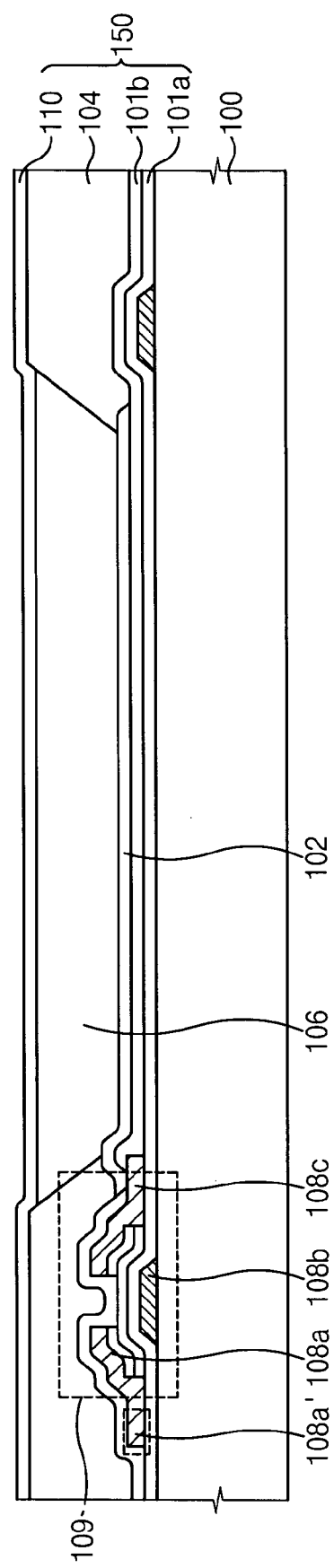
FIGS. 14 to 17 are cross-sectional views showing a method of manufacturing a flat panel display apparatus in accordance with another exemplary embodiment of the present invention.

Referring to FIG. 14, the gate insulating layer 101a, the inorganic insulating layer 101b, the switching transistor 107, the driving transistor 109, the inorganic insulating layer 101b, the anode electrode 102, the bank 104, the organic light emitting layer 106 and the cathode electrode 110 are formed on the main plate 100 so that the organic light emitting element 150 is completed.

Figure 15:
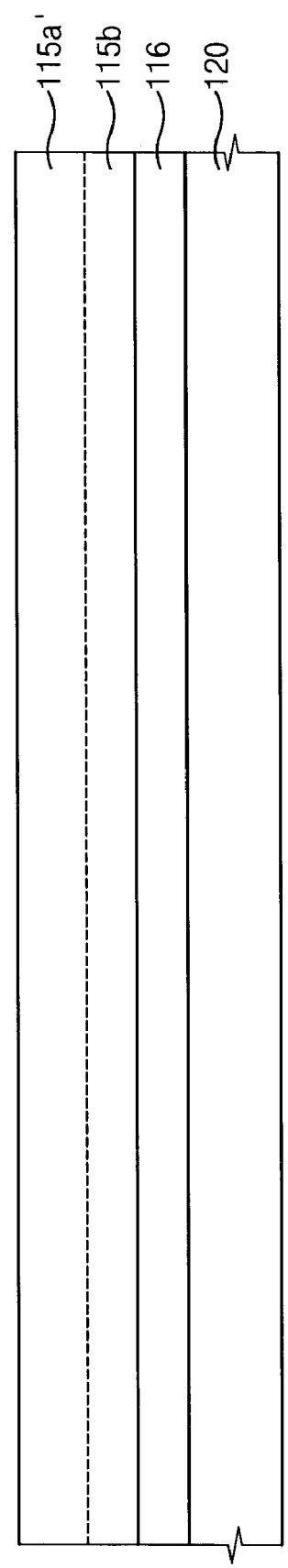

Referring to FIG. 15, 'Selfa Tape' is on the auxiliary plate 120 to form the attachable-detachable layer 116. When the light or the heat is irradiated into the attachable-detachable layer 116, the adhesiveness of the attachable-detachable layer 116 is decreased so that the attachable-detachable layer 116 is separated from the auxiliary plate 120.

The inorganic protecting layer, the organic protecting layer, etc., are formed on the attachable-detachable layer 116 to form the second protecting portion 115b. The light curable resin is coated on the second protecting portion 115b. The coated light curable resin 115a' is not solidified.

Figure 16:
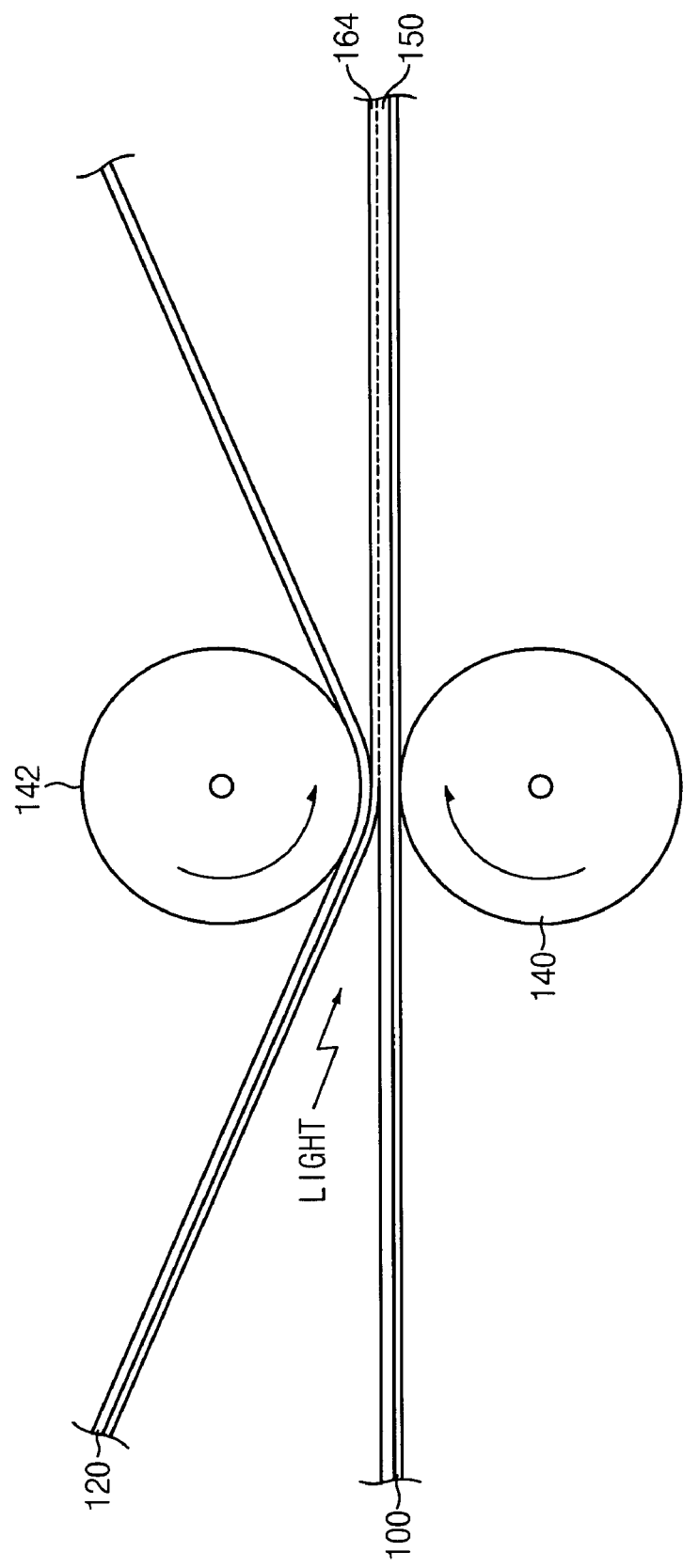
Figure 17:
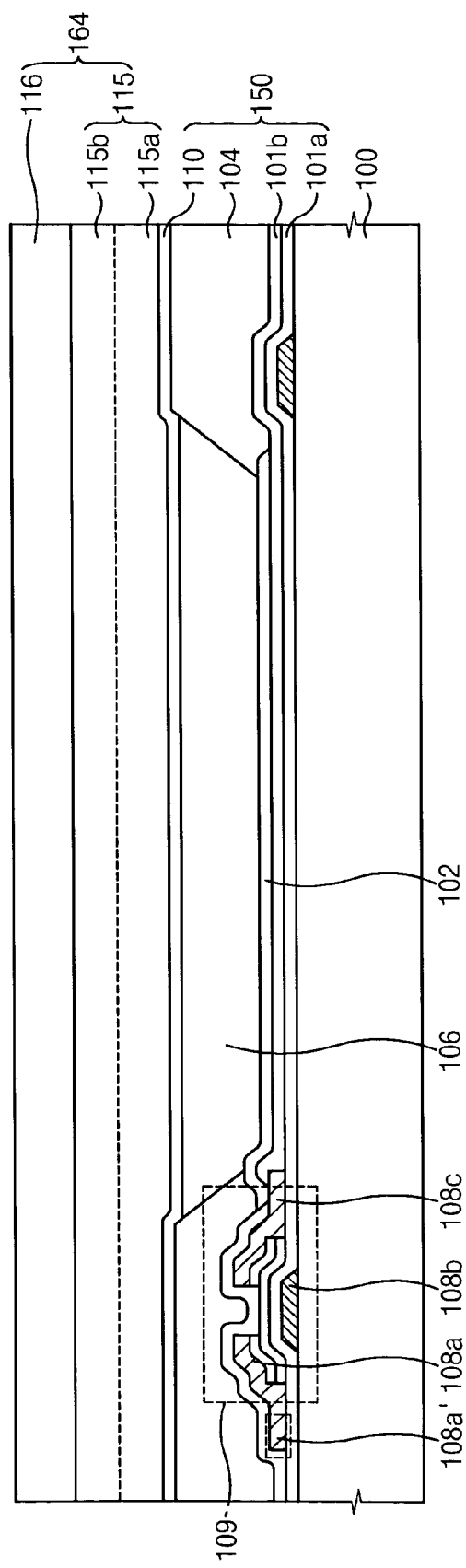

Referring to FIGS. 16 and 17, the main plate 100 having the organic light emitting element 150 is combined with the auxiliary plate 120 having the coated light curable resin 115a', the second protecting layer 115b and the attachable-detachable layer 116 so that the organic light emitting element 150 faces the coated light curable resin 115a'. The combined plates 100 and 120 are pressed between an upper roller 142 and a lower roller 140.

An ultraviolet is irradiated between the upper and lower rollers 142 and 140. When the ultraviolet ray is irradiated into the attachable-detachable layer 116 and the coated light curable resin 115a', the coated light curable resin 115a' is solidified so that the protecting layer 115 is combined with the organic light emitting element 150, whereas the adhesiveness of the attachable-detachable layer 116 is decreased so that the attachable-detachable layer 116 is separated from the auxiliary plate 120.

Therefore, the protecting film assembly 164 having the attachable-detachable layer 116 and the protecting layer 115 is formed on the organic light emitting element 150 so that the flat panel display apparatus is completed.

According to this exemplary embodiment, an adhesive layer is omitted, and the protecting layer 115 is directly attached onto the organic light emitting element 150 so that a manufacturing process of the flat panel display apparatus is simplified.

Figure 18:
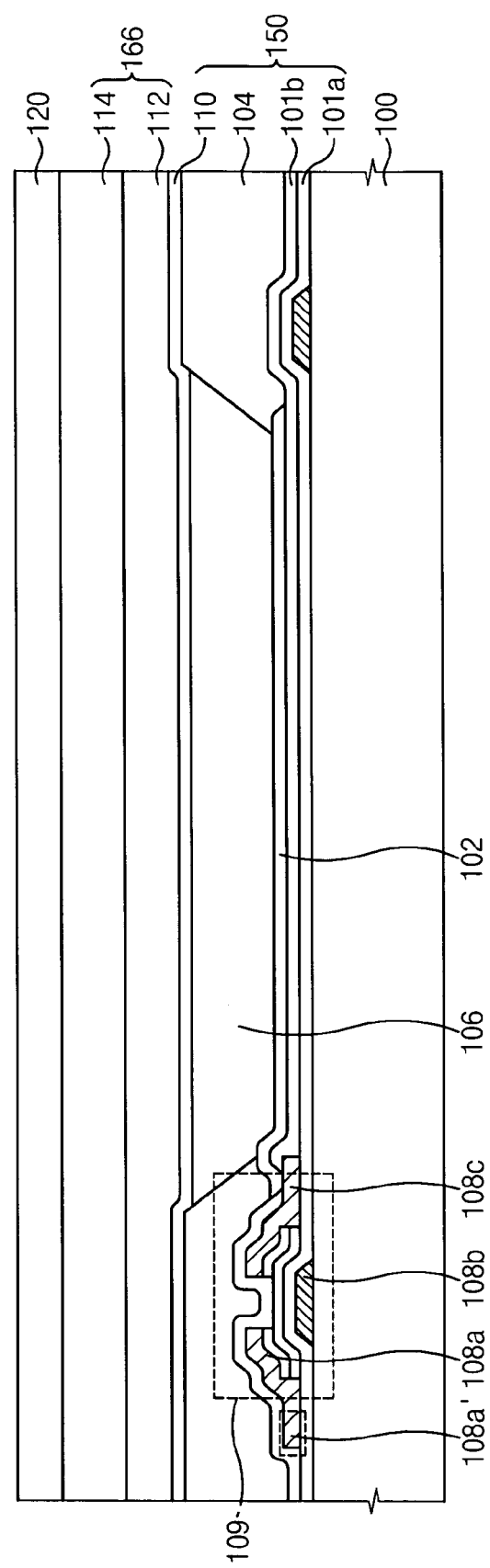
FIG. 18 is a cross-sectional view showing a flat panel display apparatus in accordance with another exemplary embodiment of the present invention.

FIG. 18 is a cross-sectional view showing a flat panel display apparatus in accordance with another exemplary embodiment of the present invention. The flat panel display apparatus of FIG. 18 is same as in FIGS. 1 and 2 except an attachable-detachable layer and an auxiliary plate. Thus, the same reference numerals will be used to refer to the same or like parts as those described in FIGS. 1 and 2 and any further explanation will be omitted.

Referring to FIGS. 1 and 18, the flat panel display apparatus includes a main plate 100, an organic light emitting element 150, a storage capacitor 103, a protecting film assembly 166 and an auxiliary plate 120.

The organic light emitting element 150 includes a gate insulating layer 101a, an inorganic insulating layer 101b, an anode electrode 102, a bank 104, an organic light emitting layer 106, a switching transistor 107, a driving transistor 109 and a cathode electrode 110.

The protecting film assembly 166 includes a protecting layer 114 and an adhesive layer 112. The protecting film assembly 166 is on the organic light emitting element 150.

The protecting layer 114 is on the adhesive layer 112 to protect the organic light emitting element 150 from an impurity or an impact that is provided from an exterior to the organic light emitting element 150.

The auxiliary plate 120 is on the protecting layer 114, and the auxiliary plate 120 makes contact with the protecting layer 114.

Alternatively, the auxiliary plate 120 may be omitted, and an attachable-detachable layer (not shown) may be on the protecting layer 114.

Hereinafter, the flat panel display apparatus in accordance with another exemplary embodiment of the present invention is manufactured as follows.

The gate insulating layer 101a, the inorganic insulating layer 101b, the switching transistor 107, the driving transistor 109, the anode electrode 102, the bank 104, the organic light emitting layer 106 and the cathode electrode 110 are formed on the main plate 100 so that the organic light emitting element 150 is completed.

An adhesive material having the light curable resin is coated on the main plate 100 having the organic light emitting element 150. The coated adhesive material (not shown) is not solidified.

Silicon oxide is deposited on the auxiliary plate 120 to form the inorganic protecting layer. Epoxy that has low permeability is coated on the inorganic protecting layer to form the organic protecting layer. Therefore, the protecting layer 114 having a double-layered structure of the inorganic protecting layer and the organic protecting layer is formed on the auxiliary plate 120 so that the organic light emitting element 150 may not be damaged, although the protecting layer 114 is formed at a high temperature, under water atmosphere or under oxygen atmosphere. In this exemplary embodiment, the protecting layer 114 is formed at a temperature of more than about 200° C. so that the permeability of the protecting layer 114 is decreased. Alternatively, the organic protecting layer may be formed on the auxiliary plate 120, and the inorganic protecting layer may be formed on the organic protecting layer.

The main plate 100 having the organic light emitting element 150 and the adhesive material (not shown) is combined with the auxiliary plate 120 having the protecting layer 114 so that the adhesive material (not shown) faces the protecting layer 114. The combined plates 100 and 120 are pressed between an upper roller 142 shown in FIG. 11 and a lower roller 140 shown in FIG. 11.

An ultraviolet is irradiated between the upper and lower rollers 142 shown in FIGS. 11 and 140 shown in FIG. 11. When the ultraviolet ray is irradiated into the auxiliary adhesive layer 118 and the adhesive material (not shown), the adhesive material (not shown) is solidified so that the protecting layer 114 is combined with the organic light emitting element 150.

Therefore, the protecting film assembly 166 having the protecting layer 114 and the adhesive layer 112 is formed on the organic light emitting element 150 so that the flat panel display apparatus is completed.

According to this exemplary embodiment, the protecting layer 114 is directly formed on the auxiliary plate 120 so that a manufacturing process of the flat panel display apparatus is simplified.

Figure 19:
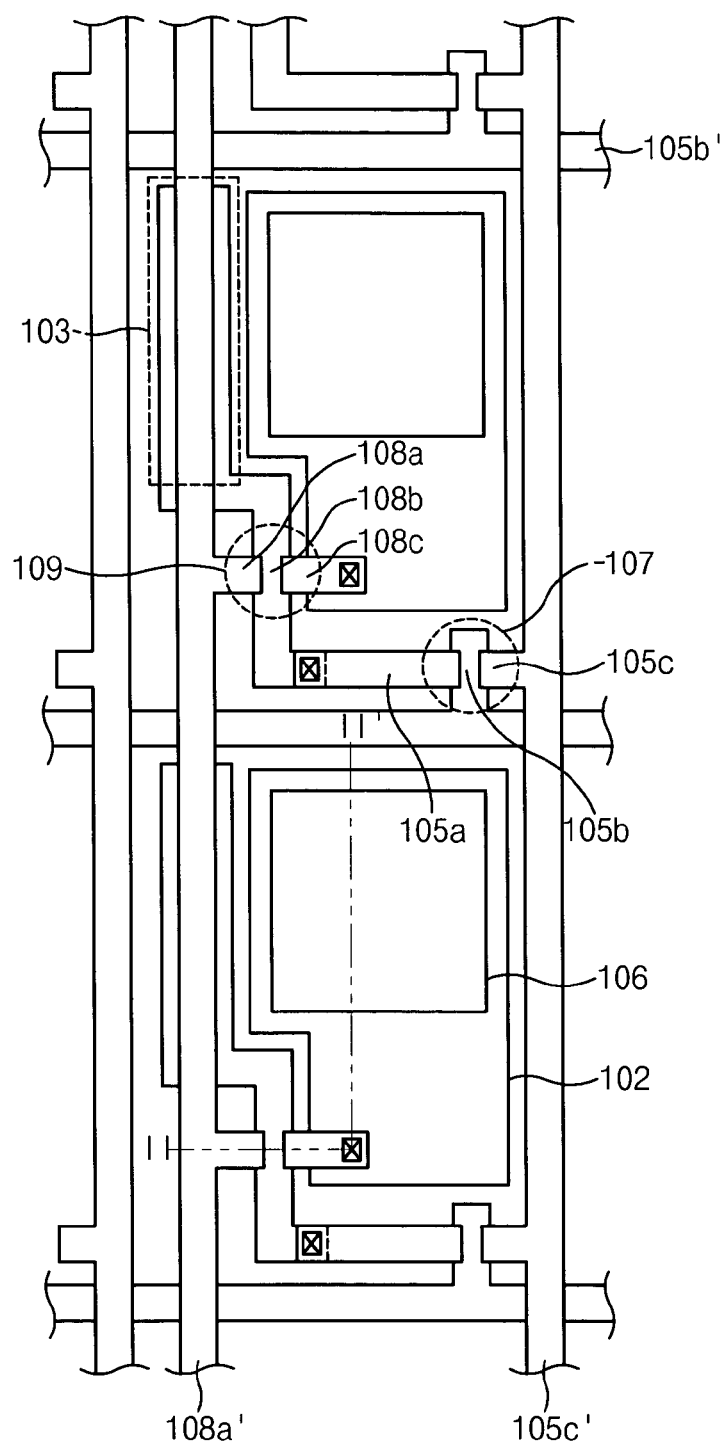
FIG. 19 is a plan view showing a flat panel display apparatus in accordance with another exemplary embodiment of the present invention.
Figure 20:
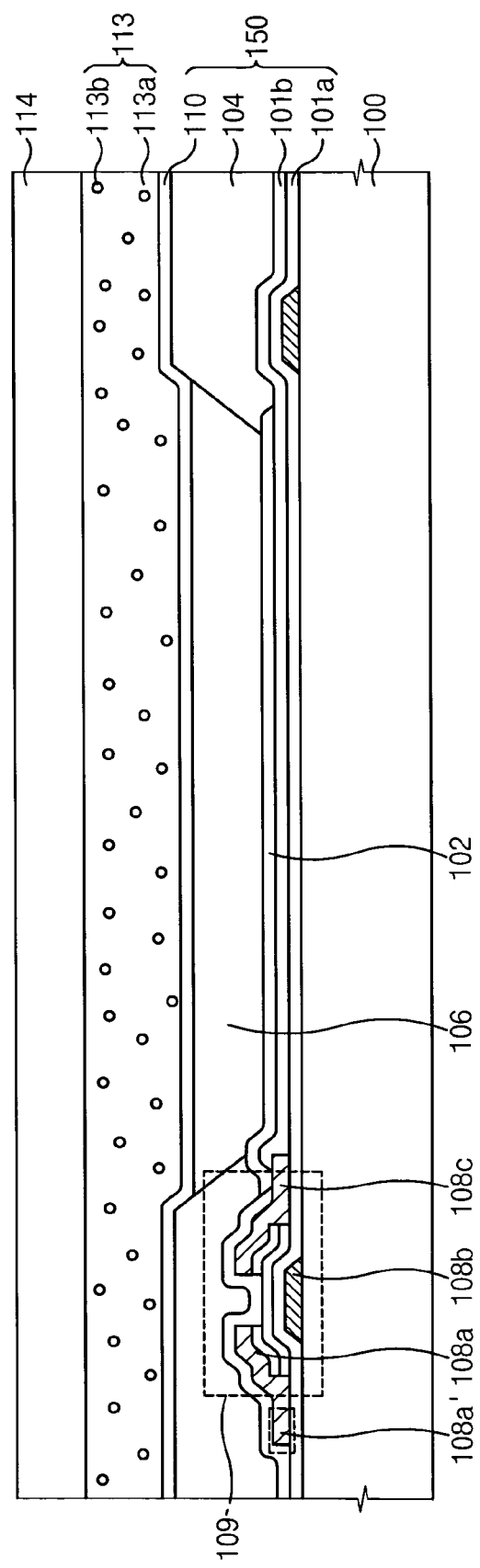
FIG. 20 is a cross-sectional view taken along the line II-II' of FIG. 19.

FIG. 19 is a plan view showing a flat panel display apparatus in accordance with another exemplary embodiment of the present invention. FIG. 20 is a cross-sectional view taken along the line II-II' of FIG. 19. The flat panel display apparatus of FIGS. 19 and 20 is same as in FIGS. 1 and 2 except an organic layer and an auxiliary plate. Thus, the same reference numerals will be used to refer to the same or like parts as those described in FIGS. 1 and 2 and any further explanation will be omitted.

Referring to FIGS. 19 and 20, the flat panel display apparatus includes a main plate 100, an organic light emitting element 150, a composite buffer layer 113 and a protecting layer 114.

The organic light emitting element 150 includes a gate insulating layer 101a, an inorganic insulating layer 101b, an anode electrode 102, a bank 104, an organic light emitting layer 106, a switching transistor 107, a driving transistor 109 and a cathode electrode 110.

The switching transistor 107 includes a first source electrode 105c, a first gate electrode 105b, a first drain electrode 105a and a first semiconductor layer pattern. The first source electrode 105c is electrically connected to a data line 105c' so that a driving integrated circuit (not shown) outputs a data signal to the first source electrode 105c through the data line 105c'. The first gate electrode 105b is on the main plate 100, and the first gate electrode 105b is electrically connected to a gate line 105b' so that the driving integrated circuit outputs a gate voltage to the first gate electrode 105b through the gate line 105b'. The first drain electrode 105a is spaced apart from the first source electrode 105c. The first semiconductor layer pattern is between the first drain electrode 105a and the first source electrode 105c.

The driving transistor 109 includes a second source electrode 108a, a second gate electrode 108b, a second drain electrode 108c and a second semiconductor layer pattern. The second source electrode 108a is electrically connected to a drain voltage line 108a' to receive a drain voltage. The second gate electrode 108b is on the main plate 100, and the second gate electrode 108b is electrically connected to the first drain electrode 105a of the switching transistor 107 through an auxiliary contact hole. The second drain electrode 108c is spaced apart from the second source electrode 108a. The second semiconductor layer pattern is between the second drain electrode 108c and the second source electrode 108a.

When the data voltage and the gate voltage are applied to the data line 105c' and the gate line 105b', respectively, the data voltage is applied to the second gate electrode 108b through the first source electrode 105c, the first semiconductor layer pattern and the first drain electrode 105a. When the data voltage is applied to the second gate electrode 108b, a channel is formed in the second semiconductor layer pattern so that the drain voltage is applied to the second drain electrode 108c.

The gate insulating layer 101a electrically insulates the first gate electrode 105b, the gate line 105b' and the second gate electrode 108b from the first source electrode 105a, the data line 105c', the first drain electrode 105c, the second source electrode 108a, the drain voltage line 108a' and the second drain electrode 108c. The gate insulating layer 101a includes a transparent insulating material such as silicon oxide, silicon nitride, etc.

The inorganic insulating layer 101b is on the main plate 100 having the switching transistor 107, the driving transistor 109, the gate line 105b', the data line 105c' and the drain voltage line 108a'. The inorganic insulating layer 101b includes a contact hole through which the second drain electrode 108c is electrically connected to anode electrode 102. The inorganic insulating layer 101b includes a transparent insulating material such as silicon oxide, silicon nitride, etc.

The second gate electrode 108b is partially overlapped with the drain voltage line 108a' to form the storage capacitor 103. The storage capacitor 103 maintains a voltage difference between the anode electrode 102 and the cathode electrode 110 for one frame.

The anode electrode 102 is on the main plate 100 in a region defined by the drain voltage line 108a', the gate line 105b' and the data line 105c'. The anode electrode 102 includes a conductive material such as a metal. Alternatively, the anode electrode 102 may include a transparent conductive material such as indium tin oxide (ITO), tin oxide (TO), indium zinc oxide (IZO), zinc oxide (ZO), etc.

The bank 104 is on the inorganic insulating layer 101b having the anode electrode 102 to form a recessed portion on a central portion of the anode electrode 102.

The organic light emitting layer 106 is in the recessed portion formed by the bank 104.

The cathode electrode 110 is on the organic light emitting layer 106 and the bank 104 to receive a common voltage. The cathode electrode 110 includes a transparent conductive material such as indium tin oxide (ITO), tin oxide (TO), indium zinc oxide (IZO), zinc oxide (ZO), etc.

The drain voltage that is applied to the second drain electrode 108c is applied to the anode electrode 102 through the contact hole. Therefore, a current flows between the anode electrode 102 and the cathode electrode 110 through the organic light emitting layer 108 so that a light is generated in the organic light emitting layer 108.

The composite buffer layer 113 includes a plurality of inorganic insulation particles 113b and an organic layer 113a. The inorganic insulation particles 113b are in the organic layer 113a. The composite buffer layer 113 having the inorganic insulation particles 113b and the organic layer 113a has lower permeability than a buffer layer without the inorganic insulation particles 113b. The composite buffer layer 113 has the inorganic insulation particles 113b of no more than about 5% by volume. When the composite buffer layer 113 has the inorganic insulation particles 113b of more than about 5% by volume, a flexibility and an adhesiveness of the composite buffer layer 113 may be decreased so that the composite buffer layer 113 may be separated from the organic light emitting element 150.

The inorganic insulation particles 113b include silicon carbide, lithium oxide, magnesium oxide, calcium oxide, silicon oxide, silica gel, aluminum oxide, titanium oxide, silicon oxynitride, silicon nitride, aluminum nitride, etc., or combinations thereof.

In this exemplary embodiment, a size of each of the inorganic insulation particles 113b is about 5 nm to about 10 μm. When the size of each of the inorganic insulation particles 113b is increased, the permeability of the composite buffer layer 113 is increased. When the size of each of the inorganic insulation particles 113b is more than about 10 μm, the composite buffer layer 113 has substantially equal permeability to the buffer layer without the inorganic insulation particles 113b. When the size of each of the inorganic insulation particles 113b is less than about 5 nm, a manufacturing cost of the inorganic insulation particles 113b may be greatly increased. Alternatively, the size of each of the inorganic insulation particles may be more than about 10 μm, or less than about 5 nm.

Although not intending to be bound by theory, one possible reason as to why the composite buffer layer 113 has lower permeability than the buffer layer without the inorganic insulation particles 113b will be described with respect to a structure of the composite buffer layer 113. The organic layer 113a has a linear shape or a net shape so that the organic layer 113a has a plurality of voids. When the inorganic insulation particles 113b are mixed with the organic layer 113a, the inorganic insulation particles 113b fill the voids of the organic layer 113a so that the permeability of the composite buffer layer 113 is decreased.

The organic layer 113a has low permeability. The organic layer 113a includes an epoxy resin, a silicone resin, a fluoric resin, an acrylic resin, an urethane resin, a phenolic resin, a polyethylene resin, a polypropylene resin, a polystyrene resin, a polymethyl methacrylate resin, a polyurea resin, a polyimide resin, a polymer resin, etc., or combinations thereof.

The permeability of the composite buffer layer 113 is determined by a kind and an amount of the inorganic insulation particles 113b, a kind of the organic layer 113a, a thickness of the composite buffer layer 113, etc. In this exemplary embodiment, the permeability of the composite buffer layer 113 is about 0.1 g/m$^2$ day to about 100 g/m$^2$ day.

The protecting layer 114 is on the composite buffer layer 113 to protect the organic light emitting element 150 from an impurity or an impact that is provided from an exterior to the organic light emitting element 150. The protecting layer 114 isolates the organic light emitting layer 106 of the organic light emitting element 150 from the water or the oxygen, and the protecting layer 114 may absorb water.

The protecting layer 114 includes an inorganic protecting layer, an organic protecting layer, a hygroscopic layer, etc., or a composite layer having combinations thereof.

Figure 21:
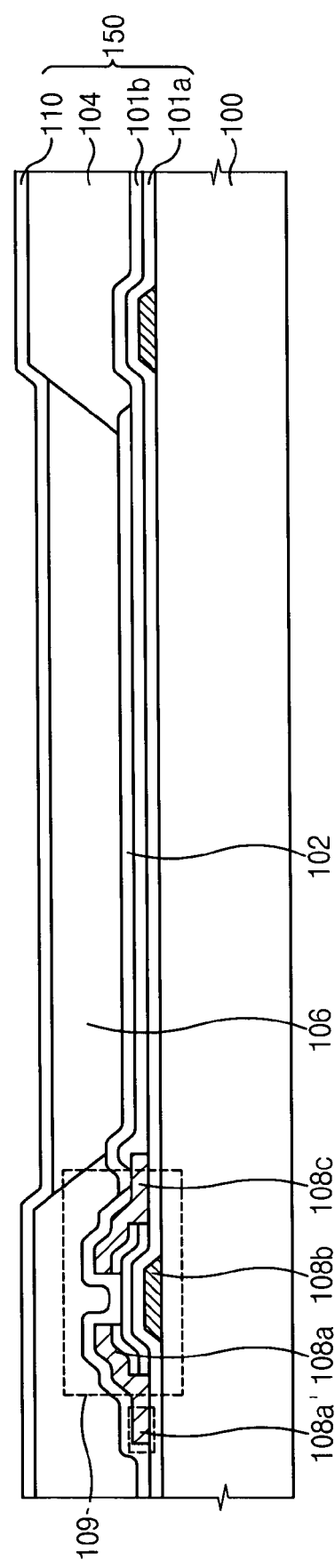
FIGS. 21 to 23 are cross-sectional views showing a method of manufacturing a flat panel display apparatus in accordance with another exemplary embodiment of the present invention.
Figure 22:
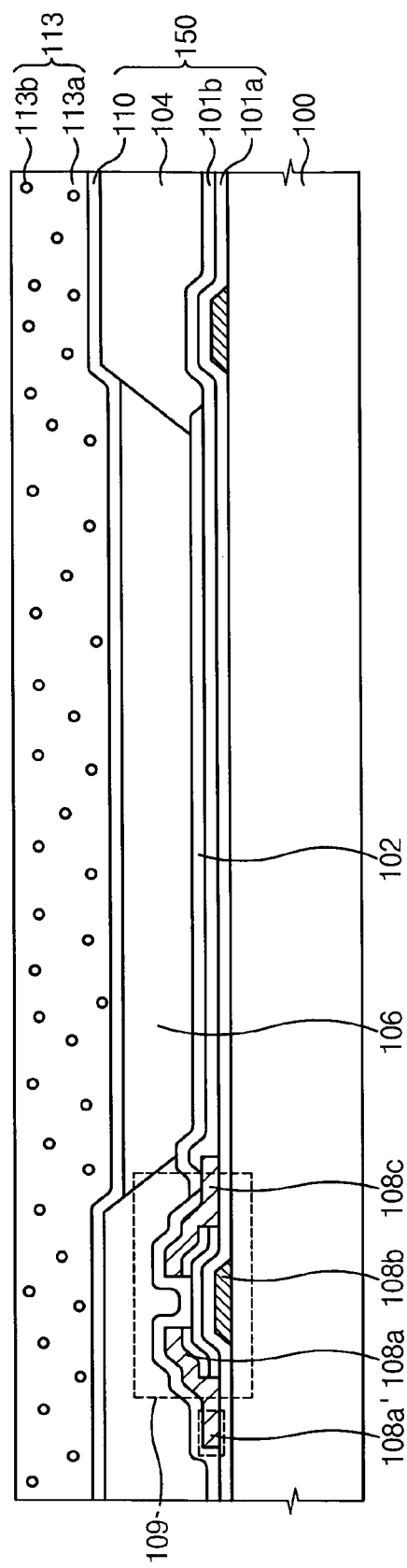
Figure 23:
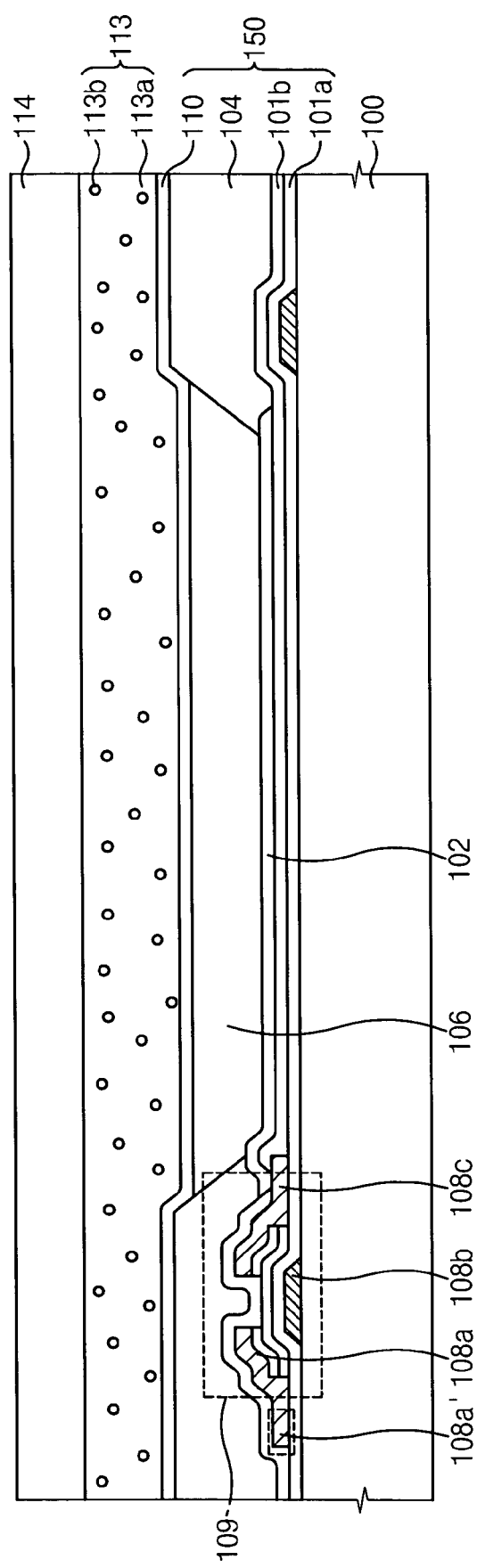

FIGS. 21 to 23 are cross-sectional views showing a method of manufacturing a flat panel display apparatus in accordance with another exemplary embodiment of the present invention.

Referring to FIG. 21, the gate insulating layer 101a, the inorganic insulating layer 101b, the switching transistor 107, the driving transistor 109, the anode electrode 102, the bank 104, the organic light emitting layer 106 and the cathode electrode 110 are formed on the main plate 100 so that the organic light emitting element 150 is completed.

Referring to FIG. 22, the composite buffer layer 113 having the inorganic insulation particles 113b and the organic layer 113a is formed on the organic light emitting element 150.

In order to form the composite buffer layer 113, a material that forms the organic layer 113a is mixed with the inorganic insulation particles 113b. The mixture of the material that forms the organic layer 113a and the inorganic insulation particles 113b has fluidity. Alternatively, the mixture of the material that forms the organic layer 113a and the inorganic insulation particles 113b may be heated or irradiated by a light so that the mixture of the material that forms the organic layer 113a and the inorganic insulation particles 113b has the fluidity. The mixture of the material that forms the organic layer 113a and the inorganic insulation particles 113b is coated on the organic light emitting element 150. The coated mixture of the material that forms the organic layer 113a and the inorganic insulation particles 113b is solidified to form the composite buffer layer 113. Alternatively, the composite buffer layer 113 may be formed on an auxiliary plate 120 shown in FIGS. 4 and 5 so that the composite buffer layer 113 may be combined with the organic light emitting element 150 by an adhesive layer 112 shown in FIG. 6.

Referring to FIG. 23, silicon oxide is deposited on the composite buffer layer 113 to form the inorganic protecting layer to form the protecting layer 114. Alternatively, epoxy resin may be coated on the inorganic protecting layer to form the protecting layer 114. The protecting layer 114 is not formed directly on the organic light emitting element 150, but formed on the composite buffer layer 113 so that the protecting layer 114 may be formed at high temperature, under water atmosphere or under oxygen atmosphere. The protecting layer 114 that is formed at the high temperature has smaller permeability than a protecting layer that is formed at low temperature.

According to this exemplary embodiment, the flat panel display apparatus includes the composite buffer layer 113 having the inorganic insulation particles 113b to protect the organic light emitting element 150 from the impurity or the impact that is provided from the exterior to the organic light emitting element 150. In addition, a thermal budget of the organic light emitting element 150 is decreased.

Figure 24:
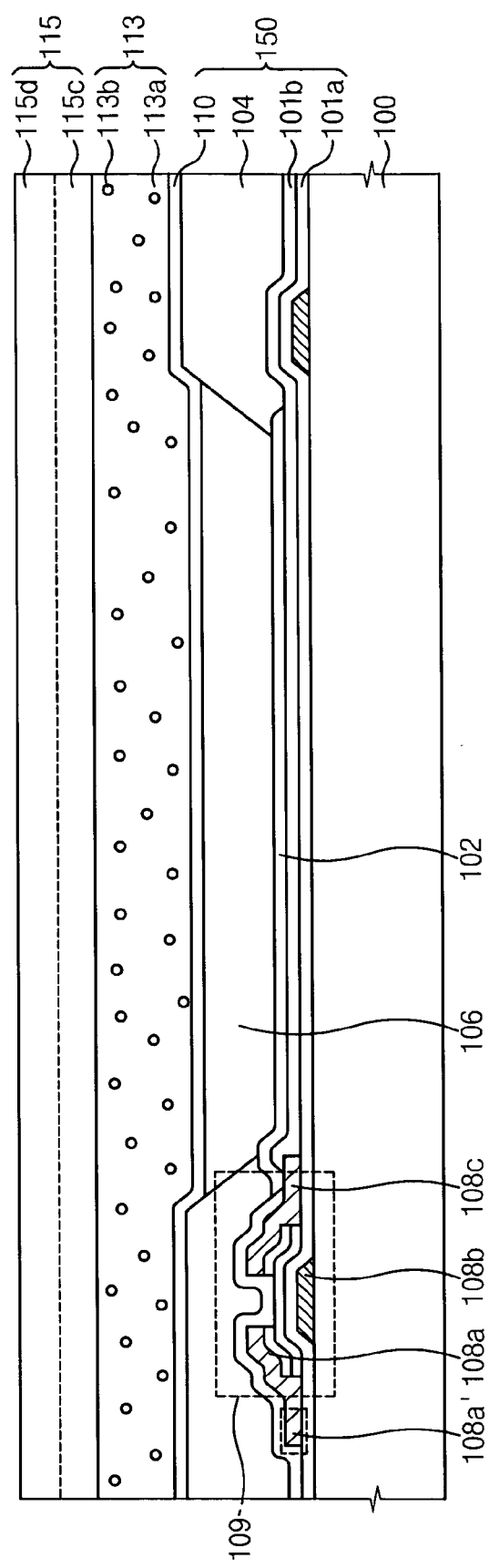
FIG. 24 is a cross-sectional view showing a flat panel display apparatus in accordance with another exemplary embodiment of the present invention.

FIG. 24 is a cross-sectional view showing a flat panel display apparatus in accordance with another exemplary embodiment of the present invention. The flat panel display apparatus of FIG. 24 is same as in FIGS. 10 and 11 except a protecting layer. Thus, the same reference numerals will be used to refer to the same or like parts as those described in FIGS. 10 and 11 and any further explanation will be omitted.

Referring to FIGS. 10 and 24, the flat panel display apparatus includes a main plate 100, an organic light emitting element 150, a composite buffer layer 113 and a protecting layer 115.

The organic light emitting element 150 includes a gate insulating layer 101a, an inorganic insulating layer 101b, an anode electrode 102, a bank 104, an organic light emitting layer 106, a switching transistor 107, a driving transistor 109 and a cathode electrode 110.

The composite buffer layer 113 is on the organic light emitting element 150 to protect the organic light emitting element 150 from a heat generated during a formation of the protecting layer 115 and an impurity that is provided from an exterior to the organic light emitting element 150.

The composite buffer layer 113 includes a plurality of inorganic insulation particles 113b and an organic layer 113a. The inorganic insulation particles 113b are in the organic layer 113a.

The protecting layer 115 is on the composite buffer layer 113 to protect the organic light emitting element 150 from the impurity or an impact that is provided from the exterior to the organic light emitting element 150. The protecting layer 115 isolates the organic light emitting layer 106 of the organic light emitting element 150 from the water or the oxygen, and the protecting layer 115 may absorb water.

The protecting layer 115 includes an inorganic protecting portion 115c and an organic protecting portion 115d that is on the inorganic protecting portion 115c. Alternatively, the protecting layer may further include a hygroscopic layer. In this exemplary embodiment, the inorganic protecting portion 115c includes silicon oxide and inorganic silica, and the organic protecting portion 115d includes epoxy.

FIGS. 25 to 28 are cross-sectional views showing a method of manufacturing a flat panel display apparatus in accordance with another exemplary embodiment of the present invention.

Figure 25:
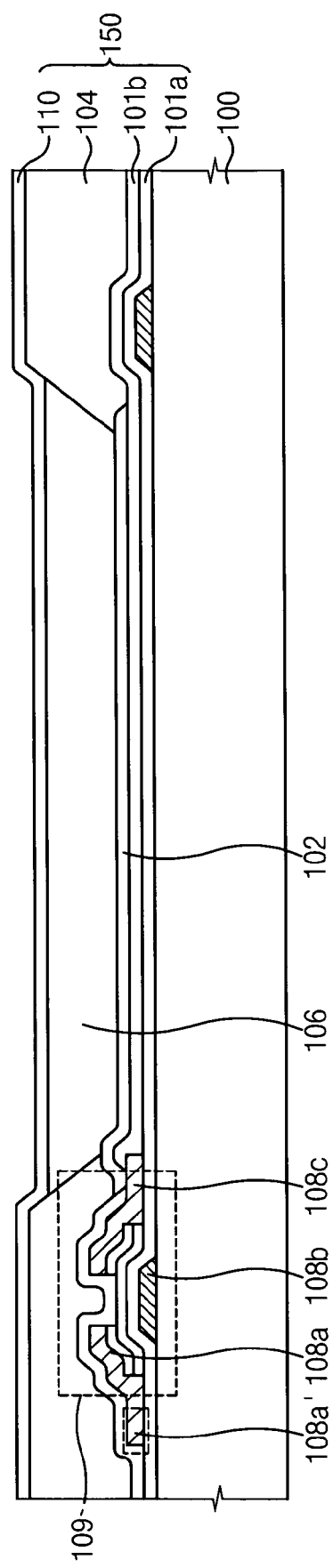
FIGS. 25 to 28 are cross-sectional views showing a method of manufacturing a flat panel display apparatus in accordance with another exemplary embodiment of the present invention.

Referring to FIG. 25, the gate insulating layer 101a, the inorganic insulating layer 101b, the switching transistor 107, the driving transistor 109, the anode electrode 102, the bank 104, the organic light emitting layer 106 and the cathode electrode 110 are formed on the main plate 100 so that the organic light emitting element 150 is completed.

Figure 26:
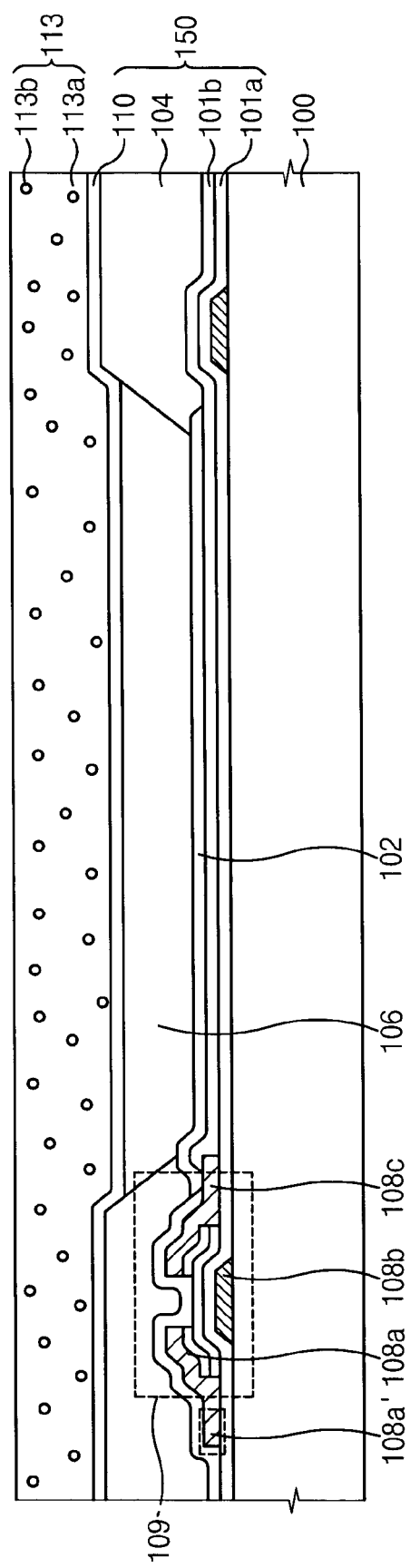

Referring to FIG. 26, the composite buffer layer 113 having the inorganic insulation particles 113b and the organic layer 113a is formed on the organic light emitting element 150.

Figure 27:
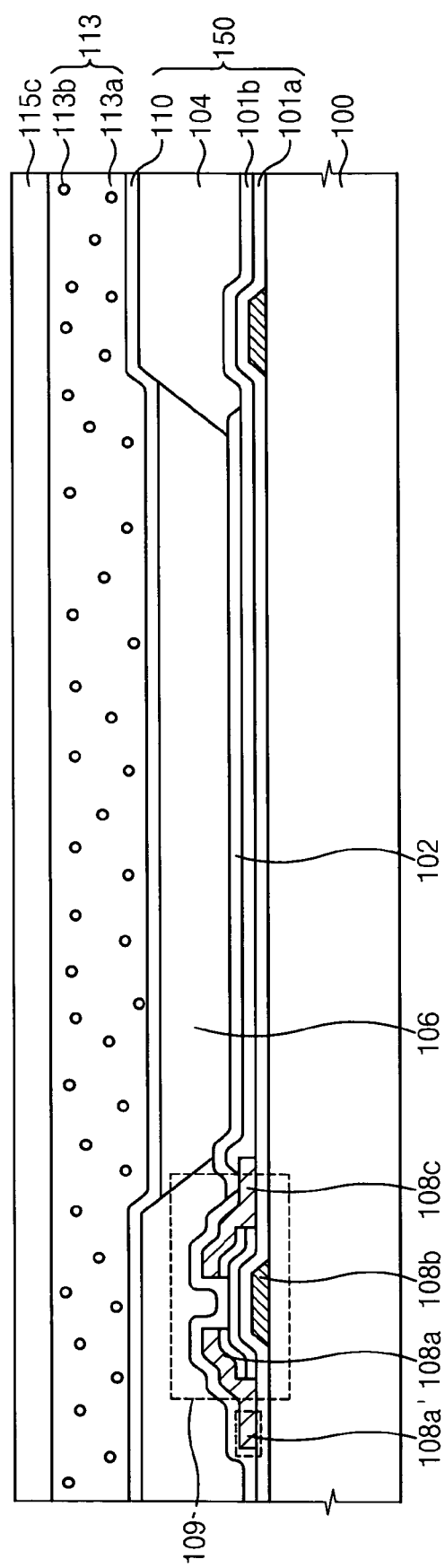

Referring to FIG. 27, silicon oxide is deposited on the composite buffer layer 113 to form the inorganic protecting portion 115c. The inorganic protecting portion 115c is not formed directly on the organic light emitting element 150, but formed on the composite buffer layer 113 so that the inorganic protecting portion 115c may be formed at high temperature, under water atmosphere or under oxygen atmosphere. Alternatively, the hygroscopic layer (not shown) may be on the inorganic protecting portion 115c.

Figure 28:
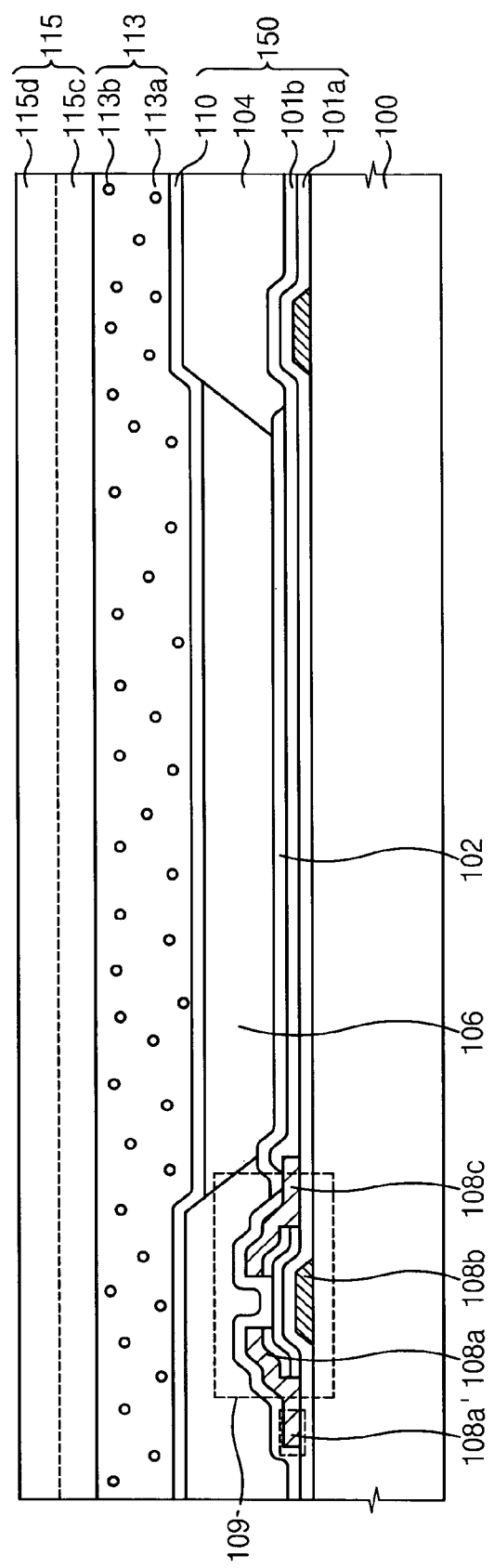

Referring to FIG. 28, the epoxy is coated on the inorganic protecting portion 115c to form the organic protecting portion 115d. Therefore, the protecting portion 115 having a double-layered structure having the inorganic protecting portion 115c and the organic protecting portion 115d is completed. Alternatively, the protecting layer 115 may have a multi-layered structure having the inorganic protecting portions and the organic protecting portions.

According to this exemplary embodiment, the protecting layer 115 includes the inorganic protecting portion 115c and the organic protecting portion 115d so that the permeability of the protecting layer 115 is decreased.

Figure 29:
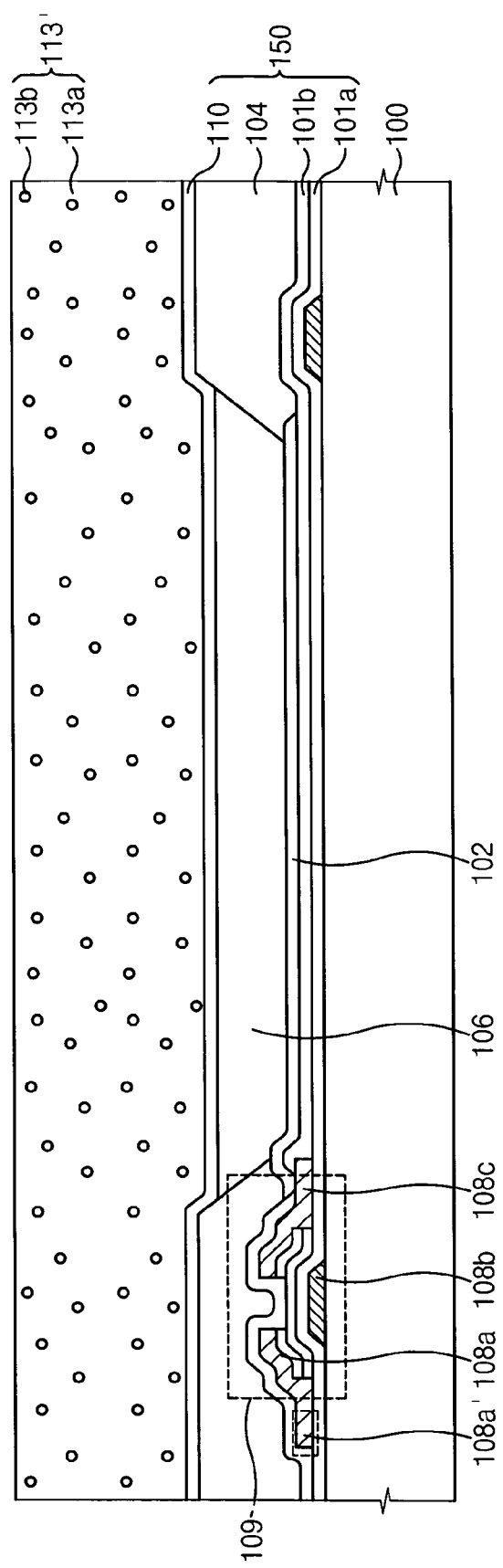
FIG. 29 is a cross-sectional view showing a flat panel display apparatus in accordance with another exemplary embodiment of the present invention.

FIG. 29 is a cross-sectional view showing a flat panel display apparatus in accordance with another exemplary embodiment of the present invention. The flat panel display apparatus of FIG. 29 is same as in FIGS. 10 and 11 except a protecting layer and a composite buffer layer. Thus, the same reference numerals will be used to refer to the same or like parts as those described in FIGS. 10 and 11 and any further explanation will be omitted.

Referring to FIGS. 10 and 29, the flat panel display apparatus includes a main plate 100, an organic light emitting element 150 and a composite buffer layer 113'.

The organic light emitting element 150 includes a gate insulating layer 101a, an inorganic insulating layer 101b, an anode electrode 102, a bank 104, an organic light emitting layer 106, a switching transistor 107, a driving transistor 109 and a cathode electrode 110.

The composite buffer layer 113' is on the organic light emitting element 150 to protect the organic light emitting element 150 from a heat generated during a formation of the protecting layer 115 and an impurity that is provided from an exterior to the organic light emitting element 150. The impurity may be water, oxygen, etc.

The composite buffer layer 113' includes a plurality of inorganic insulation particles 113b and an organic layer 113a. The inorganic insulation particles 113b are in the organic layer 113a. In this exemplary embodiment, the inorganic insulation particles 113b include silicon oxide, and the organic layer 113a includes epoxy resin. Alternatively, the inorganic insulation particles may include a hygroscopic material such as inorganic silica, silicon carbide, activated carbon, etc.

The composite buffer layer 113' functions as a protecting layer so that the flat panel display apparatus may not include any additional protecting layer. The composite buffer layer 113' has thicker thickness than a composite buffer layer 113 shown in FIGS. 10 and 11.

Figure 30:
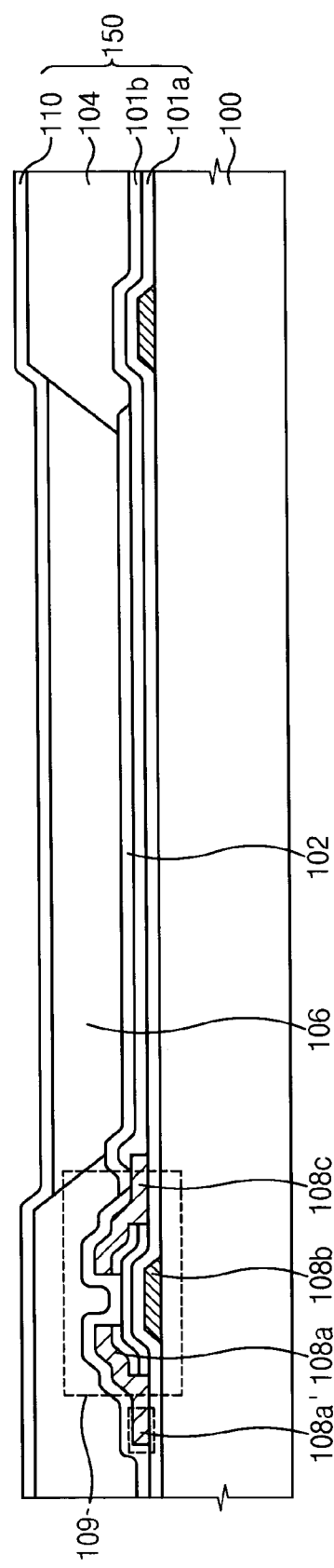
FIGS. 30 and 31 are cross-sectional views showing a method of manufacturing a flat panel display apparatus in accordance with another exemplary embodiment of the present invention.
Figure 31:
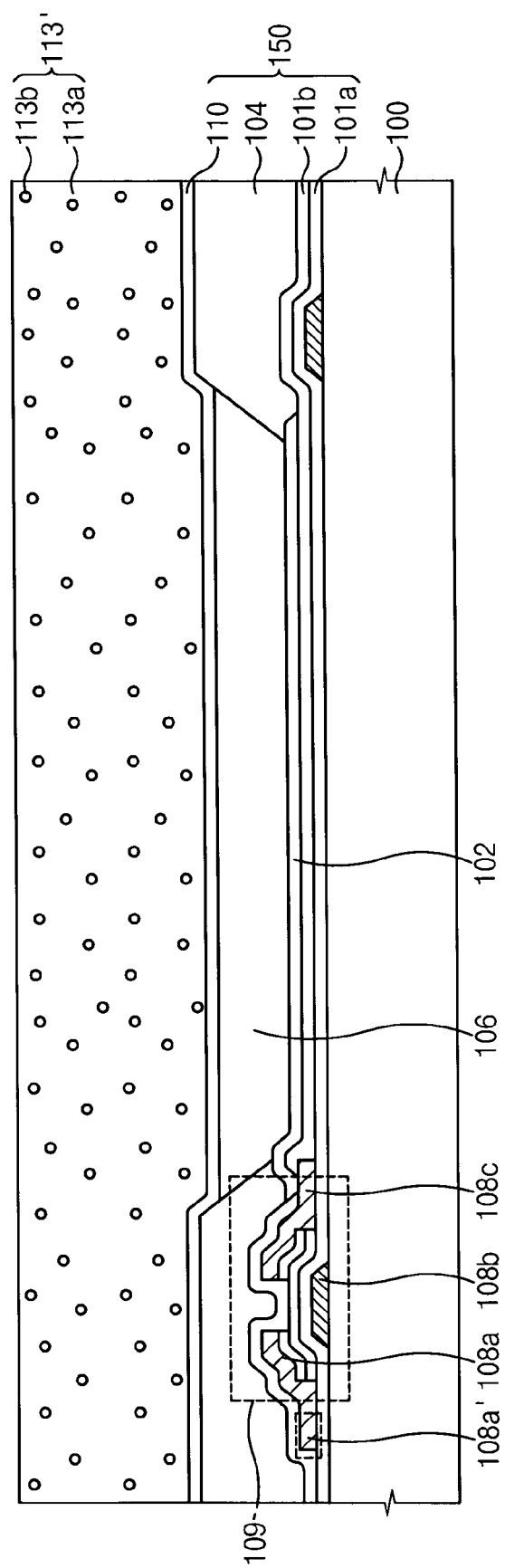

FIGS. 30 and 31 are cross-sectional views showing a method of manufacturing a flat panel display apparatus in accordance with another exemplary embodiment of the present invention.

Referring to FIG. 30, the gate insulating layer 101a, the inorganic insulating layer 101b, the switching transistor 107, the driving transistor 109, the anode electrode 102, the bank 104, the organic light emitting layer 106 and the cathode electrode 110 are formed on the main plate 100 so that the organic light emitting element 150 is completed.

Referring to FIG. 31, the composite buffer layer 113' having the inorganic insulation particles 113b and the organic layer 113a is formed on the organic light emitting element 150.

According to this exemplary embodiment, the composite buffer layer 113' functions as the protecting layer so that a manufacturing process of the flat panel display apparatus is simplified, and a manufacturing cost of the flat panel display apparatus is decreased.

INDUSTRIAL APPLICABILITY

According to the present invention, the protecting layer of the flat panel display apparatus is formed using the auxiliary plate so that a thermal budget of the organic light emitting element is decreased. In addition, the protecting layer may be formed at a high temperature so that a permeability of the protecting layer is increased, thereby improving an image display quality of the flat panel display apparatus. Also, the attachable-detachable layer may function as the auxiliary protecting layer. Furthermore, the protecting layer may be formed under oxygen atmosphere so that a manufacturing cost of the flat panel display apparatus is decreased.

In addition, the flat panel display apparatus includes the organic buffer layer that has the inorganic insulation particles to protect the organic light emitting element from an impurity or an impact that is provided from an exterior to the organic light emitting element, thereby decreasing the thermal budget of the organic light emitting element. Furthermore, the adhesive layer, the attachable-detachable layer or the protecting layer may be omitted so that the manufacturing process of the flat panel display apparatus is simplified.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

The invention claimed is:

1. A flat panel display apparatus comprising:
a main plate;
an organic light emitting element including a first electrode, a second electrode corresponding to the first electrode, and an organic light emitting layer between the first and second electrodes to generate a light based on a current that flows between the first and second electrodes through the organic light emitting layer, the organic light emitting element formed on the main plate;
a protecting layer on the organic light emitting element to protect the organic light emitting element; and
a selectively adhesive layer on the protecting layer.

2. The flat panel display apparatus of claim 1, wherein an adhesiveness of the selectively adhesive layer is changed based on a light that is irradiated into the selectively adhesive layer.

3. The flat panel display apparatus of claim 2, wherein the selectively adhesive layer comprises a photoresist.

4. The flat panel display apparatus of claim 1, wherein an adhesiveness of the selectively adhesive layer is changed based on a temperature of the selectively adhesive layer.

5. The flat panel display apparatus of claim 4, wherein the selectively adhesive layer comprises an isocynate, a vinyl acetate, a polyester, a polyvinyl alcohol, an acrylate, an epoxy, a synthetic rubber or a thermoplastic resin.

6. The flat panel display apparatus of claim 1, wherein the protecting layer comprises a first protecting portion on the organic, light emitting element and a second protecting portion on the first protection portion.

7. The flat panel display apparatus of claim 6, wherein the first protecting portion comprises an organic material, and the second protecting portion comprises an organic material, an inorganic material or a mixture thereof.

8. The flat panel display apparatus of claim 7, wherein the organic material comprises a light curable resin or a thermally curable resin.

9. The flat panel display apparatus of claim 1, further comprising an adhesive layer disposed between the organic light emitting element and the protecting layer to combine the protecting layer with the organic light emitting element.

10. The flat panel display apparatus of claim 9, wherein the adhesive layer comprises a light curable resin or a thermally curable resin.

11. A flat panel display apparatus comprising:
a main plate;
an organic light emitting element including a first electrode, a second electrode corresponding to the first electrode and an organic light emitting layer disposed between the first and second electrodes to generate a light based on a current that flows between the first and second electrodes through the organic light emitting layer, the organic light emitting element formed on the main plate;
a composite buffer layer on the organic light emitting element, the composite buffer layer including an organic layer and a plurality of inorganic insulation particles that are in the organic layer; and a protecting layer on the composite buffer layer to protect the organic light emitting element.

12. The flat panel display apparatus of claim 11, wherein each of the inorganic insulation particles comprises at least one of silicon carbide, lithium oxide, magnesium oxide, calcium oxide, silicon oxide, silica gel, aluminum oxide, titanium oxide, silicon oxynitride, silicon nitride, aluminum nitride or combinations thereof.

13. The flat panel display apparatus of claim 11, wherein a size of each of the inorganic insulation particles is about 5 nm to about 10 µm.

14. The flat panel display apparatus of claim 11, wherein the organic layer comprises at least one of an epoxy resin, a silicone resin, a fluoric resin, an acrylic resin, an urethane resin, a phenolic resin, a polyethylene, a polypropylene, a polystyrene, a polymethyl methacrylate, a polyurea, a polyimide or combinations thereof.

15. The flat panel display apparatus of claim 11, wherein the protecting layer comprises an inorganic protecting layer, an organic protecting layer or a multilayer having an inorganic protecting portion and an organic protecting portion.

16. The flat panel display apparatus of claim 11, wherein the protecting layer comprises an organic protecting layer having the inorganic insulation particles, and the organic protecting layer is integrally formed with the composite buffer layer.

17. A method of manufacturing a flat panel display apparatus, the method comprising:
    forming an organic light emitting element having a first electrode, a second electrode corresponding to the first electrode and an organic light emitting layer disposed between the first and second electrodes to generate a light based on a current that flows between the first and second electrodes through the organic light emitting layer on a main plate;
    forming an selectively adhesive layer on an auxiliary plate;
    combining the organic light emitting element with the protecting layer; and
    removing the auxiliary plate from the protecting layer using the selectively adhesive layer.

18. The method of claim 17, wherein the organic light emitting element is combined with the protecting layer by: pressing the main plate and the auxiliary plate that corresponds to the main plate between two rollers that rotate in opposite directions to each other; and irradiating a light between the main plate and the auxiliary plate.

19. The method of claim 17, wherein the organic light emitting element is combined with the protecting layer by:
    pressing the main plate and the auxiliary plate that corresponds to the main plate between an upper press and a lower press corresponding to the upper press; and
    irradiating a light into the selectively adhesive layer and the protecting layer between the main plate and the auxiliary plate.

20. The method of claim 17, further comprising forming an adhesive layer on the organic light emitting element.

21. The method of claim 20, wherein the organic light emitting element is combined with the protecting layer by:
    pressing the main plate and the auxiliary plate that corresponds to the main plate between two rollers that rotates in opposite directions to each other; and
    irradiating a light into the selectively adhesive layer and the adhesive layer between the main plate and the auxiliary plate.

22. The method of claim 17, wherein the selectively adhesive layer comprises at least one of an isocyanate, a vinyl acetate, a polyester, a polyvinyl alcohol, an acrylate, a synthetic rubber, an epoxy, a thermoplastic resin or combinations thereof.

23. The method of claim 17, wherein the protecting layer is formed by:
    forming a second protecting portion on the selectively adhesive layer;
    and forming a first protecting portion on the second protecting portion.

24. The method of claim 23, wherein the first protecting portion comprises an organic material, and the second protecting portion comprises an organic material, an inorganic material or a mixture thereof.

25. The method of claim 24, wherein the organic material comprises a light curable resin or a thermally curable resin.

26. A method of manufacturing a flat panel display apparatus, the method comprising:
    forming an organic light emitting element having a first electrode, a second electrode corresponding to the first electrode and an organic light emitting layer disposed between the first and second electrodes to generate a light based on a current that flows between the first and second electrodes through the organic light emitting layer on a main plate;
    forming a protecting layer on an auxiliary plate; and
    combining the organic light emitting element with the protecting layer.

27. The method of claim 26, further comprising forming an adhesive layer on the organic light emitting element.

28. The method of claim 26, further comprising forming an auxiliary adhesive layer between the auxiliary plate and the protecting layer.

29. A method of manufacturing a flat panel display apparatus, the method comprising:
    pressing the main plate and the auxiliary plate that corresponds to the main plate between an upper press and a lower press corresponding to the upper press; and
    irradiating a light into the selectively adhesive layer and the protecting layer between the main plate and the auxiliary plate.

30. The method of claim 29, wherein the composite buffer layer is formed by:
    mixing a material that forms the organic layer with the inorganic insulation particles;
    heating the mixture of the material that forms the organic layer and the inorganic insulation particles; and
    coating the heated mixture on the organic light emitting element.

* * * * *